United States Patent [19]
Bassous et al.

[11] Patent Number: 5,525,828
[45] Date of Patent: Jun. 11, 1996

[54] HIGH SPEED SILICON-BASED LATERAL JUNCTION PHOTODETECTORS HAVING RECESSED ELECTRODES AND THICK OXIDE TO REDUCE FRINGING FIELDS

[75] Inventors: Ernest Bassous, Bronx; Jean-Marc Halbout, Larchmont; Subramanian S. Iyer; Rajiv V. Joshi, both of Yorktown Heights, all of N.Y.; Vijay P. Kesan, Ridgefield, Conn.; Michael R. Scheuermann, Katonah; Massimo A. Ghioni, Peekskill, both of N.Y.

[73] Assignee: International Business Machines Corporation, Armonk, N.Y.

[21] Appl. No.: 294,897

[22] Filed: Aug. 23, 1994

Related U.S. Application Data

[63] Continuation of Ser. No. 8,371, Jan. 25, 1993, abandoned, which is a continuation-in-part of Ser. No. 785,736, Oct. 31, 1991, abandoned.

[51] Int. Cl.$^6$ .......................... H01L 31/07; H01L 31/108
[52] U.S. Cl. .......................... 257/457; 257/459; 257/449; 257/458
[58] Field of Search .................................. 257/449, 451, 257/458, 21, 459, 457; 257/459, 457

[56] References Cited

U.S. PATENT DOCUMENTS

| | | | |
|---|---|---|---|
| 3,549,960 | 12/1970 | Wedlock | 257/458 |
| 3,994,012 | 11/1976 | Warner, Jr. | 257/506 |
| 4,803,539 | 2/1989 | Psaras | 257/769 |
| 4,816,879 | 3/1989 | Ellwanger | 257/769 |
| 4,825,081 | 4/1989 | Wille | 257/458 |
| 4,939,561 | 7/1990 | Yamaka | 257/190 |
| 5,121,183 | 6/1992 | Ogasawara | 257/21 |
| 5,229,627 | 7/1993 | Kosaka | 257/85 |
| 7,864,378 | 9/1989 | Tsaur | 257/451 |

OTHER PUBLICATIONS

Christou et al, *Appl. Phys Lett* 48,(6) 10 Feb. 86 pp. 408–410 "Schottky . . . (Si/Si$_{1-x}$Ge$_x$): H Structures".

Primary Examiner—Jerome Jackson, Jr.
Attorney, Agent, or Firm—Thomas P. Dowd; Ronald L. Drumheller

[57] ABSTRACT

Silicon-VLSI-compatible photodetectors, in the form of a metal-semiconductor-metal photodetector (MSM-PD) or a lateral p-i-n photodetector (LPIN-PD), are disclosed embodying interdigitated metallic electrodes on a silicon surface. The electrodes of the MSM-PD have a moderate to high electron and hole barrier height to silicon, for forming the Schottky barriers, and are fabricated so as to be recessed in the surface semiconducting layer of silicon through the use of self-aligned metallization either by selective deposition or by selective reaction and etching, in a manner similar to the SALICIDE concept. Fabrication is begun by coating the exposed Si surface of a substrate with a transparent oxide film, such that the Si/oxide interface exhibits low surface recombination velocity. The interdigitated pattern is then etched through the oxide film by lithography to expose the Si surface and metallic electrode members are formed selectively in the exposed Si surface, using self-aligned metallization to produce thin interdigitated electrodes recessed below the silicon surface, which itself may be on a comparatively thin Si layer. The electrodes may be spaced to minimize the interdigital carrier transit time and maximize the sensitivity and the entire process and structure are compatible with conventional silicon integrated circuit (IC) technology. A further feature involves isolating the semiconductor surface layer from the substrate by a layer that may be either 1) transparent and insulating, 2) optically absorbing, or 3) optically reflecting, so that the photocarriers recombine before they can be collected by the field. In the latter case, the photodetector acts as a resonant cavity, resulting in an increase in the number of carriers that are generated, and hence a more sensitive device.

16 Claims, 28 Drawing Sheets

(Structure A)

(Structure B)

(Structure C)

(Structure C)

(Structure D)

HIGH SPEED SILICON-BASED LATERAL JUNCTION PHOTODETECTORS HAVING RECESSED ELECTRODES AND THICK OXIDE TO REDUCE FRINGING FIELDS

CROSS-REFERENCE

This is a continuation of application Ser. No. 08/008371, filed Jan. 25, 1993, now abandoned, which is a continuation-in-part of Ser. No. 07/785,736, filed Oct. 31, 1991, now abandoned.

BACKGROUND OF THE INVENTION

1. Field of the Invention

The present invention relates to the fabrication of semiconductor devices and more particularly to improved silicon-VLSI-compatible metal-semiconductor-metal (MSM) and lateral p-i-n (LPIN) photodetector structures and the method of making them.

2. Prior Art

Metal-semiconductor-metal photodetectors (MSM-PDs) are a class of photodetectors wherein light incident upon a semiconductor system produces photogenerated carriers, which carriers are collected via an electric field between a set of interdigitated Schottky contacts on the photoactive surface region of the semiconductor.

Lateral p-i-n photodetectors (LPIN-PDs) are a class of photodetectors wherein light incident upon a semiconductor system produces photogenerated carriers, which carriers are collected via an electric field between a set of lateral interdigitated p-n junctions on the photoactive surface region of the semiconductor.

More particularly, MSM photodetectors are constructed of interdigitated metal-semiconductor-metal electrodes that are disposed on the photoactive semiconductor material that is on the surface of the device. Their principle of operation is as follows. Upon the application of a bias voltage between the electrodes, radiation (i.e., photons) from an infra-red, visible, or UV source, impinging on the photoactive surface region of the semiconductor, will result in a current flow between adjacent electrodes. The current consists of electron-hole pairs that are generated when photons are absorbed in the semiconductor. These photogenerated charge carriers are driven and collected by the electric field that is formed by the voltage between the electrodes. A Schottky barrier at the junction or interface between each electrode and the photoactive semiconductor surface limits the current flow to that produced by the photons absorbed into the semiconductor. Photoactive materials that are most commonly used in MSM photodetectors are GaAs and GaInAs.

Among the attributes of MSM devices are their high sensitivity, very high speed of operation and relative ease of fabrication. MSM-PDs have been fabricated in a variety of semiconductor materials including silicon and the so-called III-V semiconductor compounds and their alloys. The III-V semiconductor materials are so called because they are based on elements found in column III and column V of the Periodic Table of Elements, e.g., Ga, Al, and In in column III; As, P, and Sb in column V. The most widely used III-V semiconductor materials for MSM-PDs are, as noted, GaAs and GaInAs.

The other above-noted form of photodetector involves the provision of alternate p+ and n+ implanted regions beneath and in ohmic contact with the interdigitated metal electrodes in such a manner as to create a set of lateral interdigitated p-n junctions. The resulting structure is called a lateral p-i-n photodetector (LPIN-PD). Depending on the polarity of the low doped surface region of the semiconductor ("intrinsic" layer), the p-n junctions are set between the p+ regions and the surface region (n-type semiconductor) or the n+ regions and the surface region (p-type semiconductor). In either case, the p-n junctions are operated under reverse bias in such a manner that i) the photoactive surface region between the adjacent p+ and n+ regions is completely depleted of free carriers and ii) a moderate to high electric field is established between the n+ and p+ interdigitated electrodes. Radiation (i.e., photons) from an infra-red, visible, or UV source, impinging on the photoactive surface region of the semiconductor, will result in a current flow between adjacent p+ and n+ electrodes. The current consists of electron-hole pairs that are generated when photons are absorbed in the semiconductor. These photogenerated charge carriers are driven and collected by the electric field that is formed by the voltage between the electrodes. Lateral p-i-n photodetectors have also been fabricated in GaAs and GaInAs, as described in the article:

S. TIWARI, J. BURROUGHES, M. S. MILSHTEIN, M. A. TISCHLER AND S. L. WRIGHT, "Lateral $Ga_{0.47}In_{0.53}As$ and GaAs p-i-n photodetectors by self-aligned diffusion," IEEE Photonics Technology Letters, vol. 4, no. 4, (1992).

As between the two photodetectors, MSM devices are much more common than lateral p-i-ns, and the most common MSM devices are typically made in III-V semiconductor materials that are designed to operate in the infrared region of the electromagnetic spectrum, more specifically at wavelengths greater than 700 nm. Various examples of such devices involving the elements gallium and arsenic (Ga-As) are described in:

M. ITO, T. KUMAI, H. HAMAGUCHI, M. MAKIUCHI, K, NAKAI, O. WADA, and T. SAKURAI, "High-Speed Monolithically Integrated GaAs Photoreceiver using a Metal-Semiconductor-Metal Photodiode," Appl. Phys. Lett., vol. 47, no. 11, pp. 1129–1131, 1985.

D. L. ROGERS, "Monolithic Integration of a 3-GHz Detector/Preamplifier Using a Refractory-Gate, Ion-Implanted MESFET Process," IEEE Electron Device Lett., vol. EDL-7, no. 11, pp. 600–603, 1986.

T. SUGETA, T. URISU, S. SAKATA, AND Y. MIZUSHIMA, "Metal-Semiconductor-Metal Photodetector for High-Speed Optoelectronic Circuits," Japan. J. Appl. Phys., vol. 19, suppl. 19-1, pp. 459–464, 1980.

O. WADA, H. NOBUHARA, H. HAMAGUCHI, T. MIKAWA, A. TACKEUCHI, and T. FUJII, "Very High Speed GaInAs Metal-Semiconductor-Metal Photodiode Incorporating an AlInAs/GaInAs Graded Superlattice," Appl. Phys. Lett. vol: 54, no. 1, pp. 16–17, 1989.

D. L. ROGERS, J. M. WOODALL, G. D. PETTIT, AND D. MCINTURFF, "High-Speed 1.3-μm GaInAs Detectors Fabricated on GaAs Substrates," IEEE Electron Device Lett., vol. 9, no. 10, pp. 515–517, 1988.

C. S. HARDER, B. VAN ZEGHBROECK, H. MEIER, W. PATRICK. and P. VETTIGER "5.2-GHz Bandwidth Monolithic GaAs Optoelectronic Receiver," IEEE Electron Device Lett., vol. 9, no. 4, pp. 171–173, 1988.

W. ROTH, H. SCHUMACHER, J. KLUGE, H. J. GEELEN, and H. BENEKING, "The DSI Diode—A Fast Large-Area Optoelectronic Detector," IEEE Trans. Electron Devices, vol. ED-32, no. 6, pp. 1034–1036, 1985.

M. ITO AND O. WADA, "Low Dark Current GaAs Metal-Semiconductor-Metal (MSM) Photodiodes Using WSi$_x$ Contacts," IEEE J. Quantum Electronic, vol QE-22, no. 7, pp. 1073–1077, 1986.

L. FIGUEROA AND W. SLAYMAN, "A Novel Heterostructure Interdigital Photodetector (HIP) with Picosecond Optical Response," IEEE Electron Device Lett., vol. EDL-2, no. 8, pp. 208–210, 1981.

On the other hand, short wavelength (<850 nm) photodetectors are also important as they have potential widespread use in computing environments. For example, in optical storage systems, short wavelengths are preferred because recording density on optical disks can be increased. A further possible application of short wavelength detectors is in optical fiber interconnects to replace the expensive, bulky cables that are used with input/output (I/O) devices such as printers, monitors, and displays. For the latter application, the path lengths within the computer system are short, and consequently long wavelength detectors are not a critical requirement.

While all the MSM photodetectors cited above have been fabricated in the form of either discrete or integrated structures, they suffer from major drawbacks with regard to their integration into silicon-based technologies as presently practised in the computer industry. These drawbacks include high cost due to process complexity, and the use of materials and processes which are incompatibile with established silicon VLSI fabrication methods.

A particular drawback of GaAs MSM-PDs is the difficulty of incorporating them into silicon integrated circuits. A silicon-based photodetector technology could better fulfill the requirements for the above-noted computer environment applications with the key advantage of integrability with a mature CMOS or bipolar technology. This technology would render the incremental cost of the photodetectors minimal, and parasitic delays and costly assembly could be eliminated. Such MSM photodetectors lend themselves to easy integration and have the advantage of low capacitance combined with good responsivity. See, for example, the above-cited article of M. ITO ET AL, in Appl. Phys. Lett., vol. 47, no. 11, pp. 1129–1131, 1985.

Some silicon MSM photodetectors which operate in the ultraviolet region of the spectrum, more specifically at wavelengths below 400 nm, have been reported and described in the technical literature. Descriptions of MSM-PD's fabricated on bulk Si to avoid the problems with short wavelength applications are found, for example, in the recent article: B. W. MULLINS, S. F. SOARES, K. A. MCARDLE, C. M. WILSON AND S. R. J. BRUECK, "A Simple High-Speed Si Schottky Photodiode," IEEE Photonics Technol. Letts., vol., 3, no. 4, pp. 360–362, 1992.

Some earlier work in silicon-based MSM technology is described in the article:

R. J. SEYMOUR AND B. K. GARSIDE, "Ultrafast Silicon Interdigital Photodiodes for Ultraviolet Applications," Can. J. Phys., vol. 63, pp. 707–711, 1985.

In the former article, Schottky barriers are formed by disposing interdigitated metal fingers of Ni on bulk Si, while in the latter case the metal is Au on n-type Si on sapphire. However, the materials and processes employed in the fabrication of these devices are not compatible for purposes of integration with established silicon VLSI technology.

Consequently, it is an object of the present invention to provide a photodetector device that is compatible with silicon integrated circuits and suitable for short wavelength applications.

Another object of the present invention is to provide a photodetector with more efficient light sensitivity and speed of response.

Another object of the present invention is overcoming the problem in semiconductor photodetectors with interdigitated surface electrodes posed by longer wavelength light generating carriers deep within the semiconductor, beyond the influence of the electric field of the interdigitated surface electrodes and thus slow to be collected and slowing down the photoresponse of the detector.

Another object of the present invention is providing for the protection and passivation of the surface region of such photodetectors between the interdigitated electrodes, and extending the spectral sensitivity of the photoactive semiconductor surface region of the device.

A further object of the present invention is to reduce the electric field strength at the metal finger edges of MSM photodetectors, thus reducing the excessive leakage current due to tunneling and Schottky barrier-lowering phenomena.

SUMMARY OF THE INVENTION

The present invention is directed to providing an improved photodetector having an electrode array formed in such a manner as to render it more compatible with silicon integrated circuits and suitable for short wavelength applications, while adaptable for use at other wavelengths. More particularly, the method and product of the present invention involve, for example, a metal-semiconductor-metal (MSM) photodetector with surface semiconducting layers of silicon and with its Schottky-barrier-diode interdigitated metal electrodes of a metal or silicide having a moderate to high electron and hole barrier height to silicon so that a bias voltage may be applied between them. The electrode members are recessed in the silicon surface and may be fabricated using self-aligned metallization either through selective deposition or by selective reaction and etching, in a manner similar to the SALICIDE concept. The SALICIDE, i.e. Self-ALigned-SilICIDE, process is based on the fact that in selective deposition methods, applied metal coatings adhere only to the exposed regions of the silicon surface where the metal is in intimate contact with silicon. Examples of such metals include thin films of Tungsten (W) and titanium (Ti) which adhere only to silicon but not to protected or masked regions of the silicon surface. The SALICIDE concept and its implementation with titanium silicide (TiSi$_2$) in silicon VLSI structures are described in detail in two articles published in the Proceedings of the First International Symposium on Very Large Scale Integration Science and Technology, 1982, Proceedings Volume 82-7 of the Electrochemical Society, Inc. The first article "High Conductivity Diffusions and Gate Regions Using Self-Aligned Silicide Technology," by C. M. OSBURN, M. Y. TSAI, S. ROBERTS, C. J. LUCCHESE, and C. Y. TING, discusses the fabrication of self-aligned silicide structures using conventional NMOS technology. The second article "The Use of TiSi$_2$ in a Self-Aligned Silicide Technology", by C. Y. TING, S. S. IYER, C. M. OSBURN, G. J. HU AND A. M. SCHWEIGHART, discusses the formation and material characteristics of TiSi$_2$.

In the preferred procedure, to begin a fabrication process according to the invention, the exposed Si surface of a substrate is coated with a transparent oxide film in such a manner that the Si/oxide interface exhibits low surface recombination velocity and low interface state density and thus lends itself to enhanced sensitivity and high speed operation of the resulting photodetector. An interdigitated pattern is etched through the oxide film by suitable lithographic techniques to expose the Si surface in the form of the pattern. Members of metal silicide are then formed selectively in the exposed Si surface using self-aligned metallization to produce interdigitated silicide electrodes with well rounded profiles recessed into the silicon surface, which electrodes may be so spaced as to optimize the interdigital carrier transit time and the photosensitivy.

Alternatively, rather than using metal deposition and chemical reaction with the silicon surface to form the metal silicide as in the preferred fabrication technique, the metal silicide can also be directly deposited on the Si surface from a metal silicide source and the resulting metal silicide film then delineated by lithographic methods to generate the desired recessed silicide electrode pattern.

Another example and feature of the present invention directed to reducing the leakage current, involves the provision of n+ and p+ implanted regions beneath the interdigitated electrode fingers. The fabrication procedure begins with coating the exposed Si surface of a substrate with a transparent oxide film. A first set of fingers is etched through the oxide film by suitable lithographic techniques to expose the Si surface. Shallow (depth≈0.3 μm) n+ regions are then formed by ion implantation through the openings. A second set of fingers, interdigitated to the fingers of the first set, is then etched through the oxide and shallow p+ regions are formed by ion implantation. Members of metal or metal silicide are then formed selectively in the exposed Si surface using self-aligned metallization to provide ohmic contacts to the n+ and p+ regions. The resulting structure is a lateral interdigitated p-i-n photodiode, where the implanted regions act as the p and the n side of the junction and the low-doped silicon substrate acts as the intrinsic region. Although a more complicated fabrication process is required, p-i-n junctions exhibit a much lower leakage current as compared to Schottky junctions having moderate barrier heights. This is particularly of value in low noise applications, like optical storage, requiring very low leakage currents.

Irrespective of the type of junctions used, it is preferred that the oxide be a high-quality transparent silicon dioxide film that protects and passivates the photoactive silicon surface region of the photodetector between the interdigitated electrodes. Although interdigital capacitance is increased by the oxide, it also tends to be decreased by the use of the thin metallic electrodes recessed below the silicon surface, which surface may be on a comparatively thin layer, and the entire process and structure are compatible with conventional silicon integrated circuit technology.

Another feature of the present invention is directed to reducing the excessive leakage current due to the enhanced electric field at the electrode finger edges of the MSM-PDs (edge-effects) and involves the provision of a semi-recessed or a fully-recessed passivating silicon dioxide. In either case, the recessed passivating oxide is designed in such a manner that the silicon dioxide/silicon interface is recessed below the metal/silicon interface. As a consequence, the edges of the metallic fingers are surrounded by thermally grown silicon dioxide on all sides, thus reducing the peripheral fringing electric field. Both semi-recessed and the fully-recessed passivating oxides are widely used in VLSI technology in order to isolate active devices from each other; however, here they are used within a device to control the fringing electric field.

The process leading to the formation of the recessed oxide, termed LOCOS (LOcal Oxidation of Silicon), utilizes a patterned $Si_3N_4$ film as an oxidation barrier to define the active regions, while a thick film of $SiO_2$ is thermally grown as the isolation field oxide. The LOCOS process is described in detail in:

J. A. APPELS, E. KOOI, M. M. PAFFEN, J. J. SCHATORJE, and W. H. C. G. VERKUYLEN, "Local Oxidation of Silicon and Its Application in Semiconductor-Device Technology," Phillips Res. Repts., vol. 25 p. 118, 1970; and E. KOOI, and J. J. APPELS, "Selective Oxidation of Silicon and Its Device Application," Semiconductor Silicon 1973, J. R. Huff and R. R. Burgess Eds., The Electrochemical Society, Princeton, N.J., pp. 860–879, 1973.

An advanced Poly-Buffered (PB) LOCOS dielectric isolation scheme suitable for designing devices with 1.0 μm active regions and 1.2 μm isolation spacings is described in detail in:

R. L. GULDI, B. McKEE, G. M. DAMMINGA, C. Y. YOUNG, AND M. A. BEALS, "Characterization of Poly-Buffered LOCOS in Manufacturing Environment," J. Electrochem. Soc., vol. 136, no. 12, pp. 3815–3820, 1989.

The use of a semi-recessed silicon dioxide layer for reducing edge effects and improving the breakdown performance in Schottky diodes is demonstrated in:

N. G. ANANTHA AND K. G. ASHAR, "Planar Mesa Schottky Barrier Diode", IBM J. Res. Develop., vol. 15, pp. 442–445, 1971.

Another feature of the invention involves adjusting the thickness of the transparent oxide film to act as an antireflective film at the desired wavelength of operation. For best performance the optical film thickness should be an odd integer multiple of a quarter of the operating wavelength $\lambda$, such that the film thickness T is given by $T=(2k+1)\lambda/4n$, where k is zero or an integer, and n is the refractive index of the film.

Further, the spectral sensitivity of the silicon of the photoactive surface region may be extended with a Ge additive, resulting in a Si-Ge, i.e., $Si_{1-x}Ge_x (0<x<1)$, layer. For example, in one embodiment of the invention, such a layer of Si-Ge alloy, approximately 1 μm to 3 μm thick, is grown epitaxially on the substrate surface and overcoated with a thin layer of single crystal Si, approximately 0.25 μm thick, forming a high-quality passivating film over the photoactive Si-Ge layer after coating with the oxide layer. The composition of the Si-Ge photoactive surface layer can be adjusted to contain an amount of germanium that varies, as noted, from 0% Ge to 100% Ge. By virtue of the greater optical absorption of Ge at long wavelengths, the photosensitivity of the the Si-Ge layer can thus be extended to a wavelength of 850 nm and beyond up to about 1.8 μm.

The addition of Ge to Si has the further advantage of increasing the speed of the device at short wavelengths due to the diminished penetration depth of impinging photons in this material. Carriers that might otherwise be generated at large distances from the electric field at the surface do not materialize. By adjusting the Si-Ge composition, carrier generation is confined very close to the surface of the device where the electric field is most intense. This has the desirable effect of increasing the photoresponse speed of the detector. Thus, the advantageous adjusting of the material composition and structure of the surface of the detector offers enhancement of the performance and the stability of the photodetector, while facilitating the integration of silicon MSM detectors into standard silicon VLSI fabrication methods.

A further feature of the present invention directed to increasing the sensitivity and speed of the device, involves overcoming the problem posed by light-generated carriers deep within the semiconductor, beyond the influence of the electric field of the interdigitated surface electrodes, which carriers are thus slow to be collected and slow down the photoresponse of the detector. The problem is solved by isolating the semiconductor surface layer from the substrate with a barrier layer. The barrier layer may be either 1) non-reflecting and insulating, or 2) optically absorbing, so that the photocarriers recombine before they can be collected by the field, or 3) the layer may be an optical reflecting dielectric layer (or stack of layers), e.g., a dielectric mirror. By adding such a buried mirror, the device structure resembles a Fabry-Perot resonant cavity where the passivating layer (e.g., $SiO_2$) acts as the top mirror and the silicon surface layer acts as the absorbing spacer. As a consequence, the absorbance of the silicon active layer can be maximized at any desired wavelength by simply adjusting the silicon layer thickness and the mirrors reflectivities (if required, the top mirror reflectivity can be increased by replacing the passivating layer with a multilayer dielectric mirror). In other words, at the resonant wavelength the incoming light undergoes multiple reflections between the top and the bottom mirror. Each reflection from one of the cavity mirrors results in the generation of additional electron-hole pairs as the light traverses the photoactive layer. This allows more efficient capture of all the incident light within the photoactive region, resulting in a more sensitive device. The speed of the device is not affected by this measure because no carriers are generated at long distances from the active surface region.

DETAILED DESCRIPTION OF THE INVENTION

Figure 1:
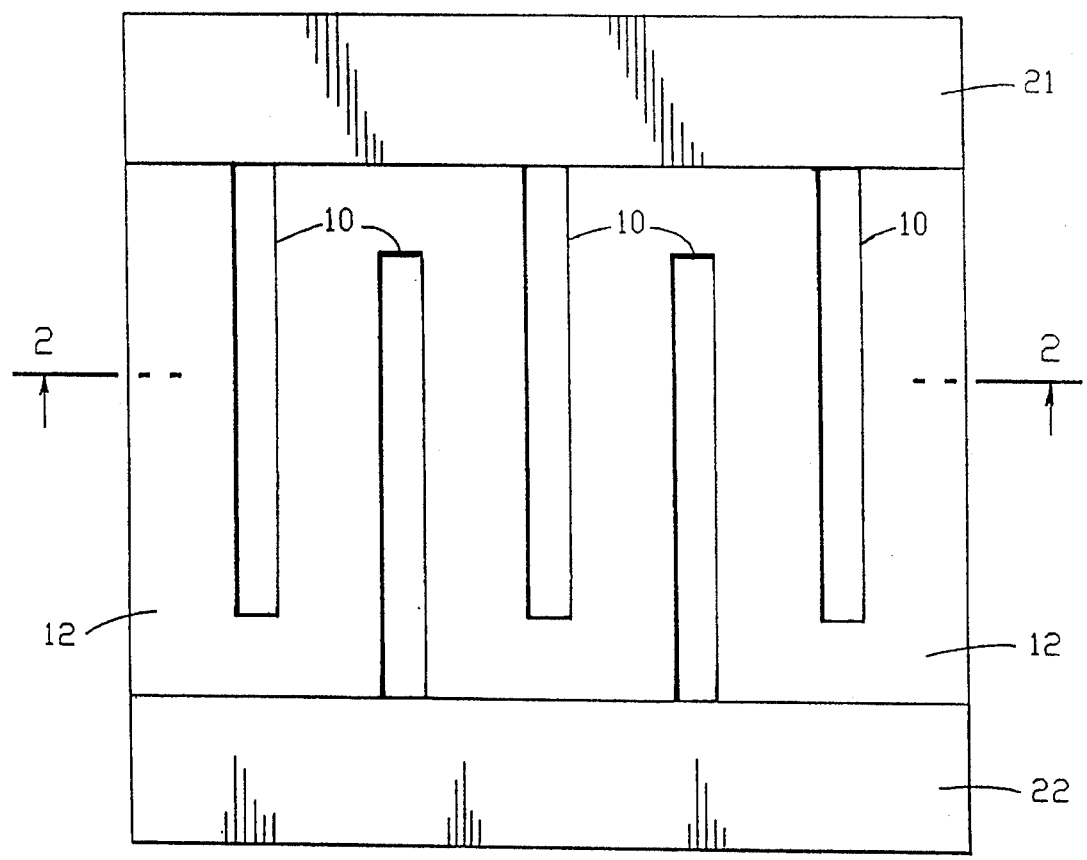
FIG. 1 is a plan view of an MSM photodetector in accordance with the present invention.
Figure 2:
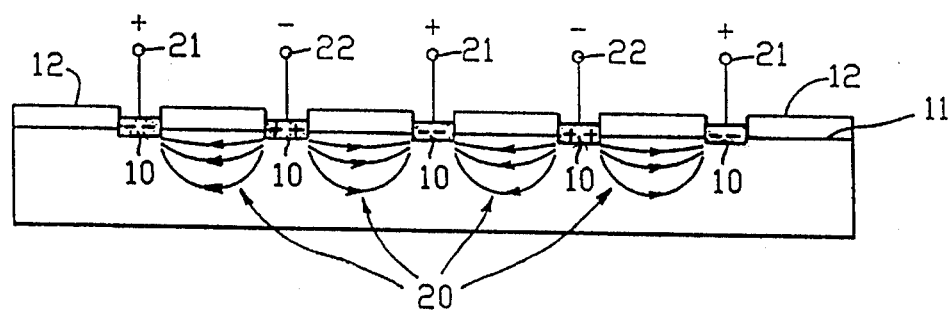
FIG. 2 is a cross-sectional view of the MSM photodetector shown in FIG. 1.

FIG. 1 is a plan view of the essential elements of an MSM-PD structure in accordance with the present invention. It consists basically of an electrode pattern of interdigitated members or fingers 10 formed of a metal or silicide in two cooperating sets in a silicon surface 11 (FIG. 2) by means of a self-aligned or selective process. The electrode metal may be a silicide such as PtSi, $TiSi_2$, $WSi_2$, $PdSi_2$, or metal such as W, Ti, Pt, Pd, and Hf. The electrode material may also be chosen to be transparent at the desired wavelength of operation, e.g., such electrodes can consist of indium-tin oxide (ITO). The key property of the material is a moderate to high electron and hole barrier height to Si so that a high enough bias may be applied between the electrode elements 10. The interdigital space on the surface 11 is coated with a transparent film 12, such as of silicon dioxide ($SiO_2$), silicon nitride ($Si_3N_4$), or silicon oxynitride, to ensure a low surface recombination velocity which is a requirement for high speed operation. Electrical contact pads 21 and 22 are respectively connected to the two sets of electrodes by means of which an electrical potential may be applied between adjacent electrode elements or members 10 creating a series of interdigital electric fields 20 as seen in the cross-sectional view of FIG. 2.

The preferred arrangement and method of fabrication involves a self-aligned metallization process which is carried out generally in such manner so as to ensure that at least the following criteria are met:

1. The interdigitated electrodes 10 are non-shorting, with a small interdigital space chosen to be comparable in dimension to the absorption length at the wavelength of operation and also to optimize device performance.
2. The interdigital oxide or nitride coating 12 is transparent to most wavelengths and ensures a low surface recombination velocity.
3. The interdigital oxide or nitride coating 12 is adjusted in thickness to function as an antireflective coating.
4. The reaction that forms the silicide results in well rounded (not sharp) profiles of the electrodes in Si and thus eliminates breakdown related problems.
5. The interdigitated electrodes 10 are of a thin metal or silicide which is recessed below the Si surface 11 (FIG. 2).
6. Metals and silicides are used with high enough electron and hole barrier heights to Si.
7. The fabrication process and structure are compatible with conventional silicon integrated circuit technology.
8. The photoactive region of the device is confined to a surface layer of a conventional single crystal silicon substrate or to an epitaxial layer that is grown on the surface of a silicon substrate.
9. The epitaxial surface layer is adjustable in composition and thickness to contain silicon and germanium in a composition range that can be varied from 0% to 100% germanium in silicon, and may be formed into a layered structure comprising a thin layer of single crystal silicon on a single crystal Si-Ge alloy, i.e., $Si_{1-x}$ (0<x<1).

Figure 3:
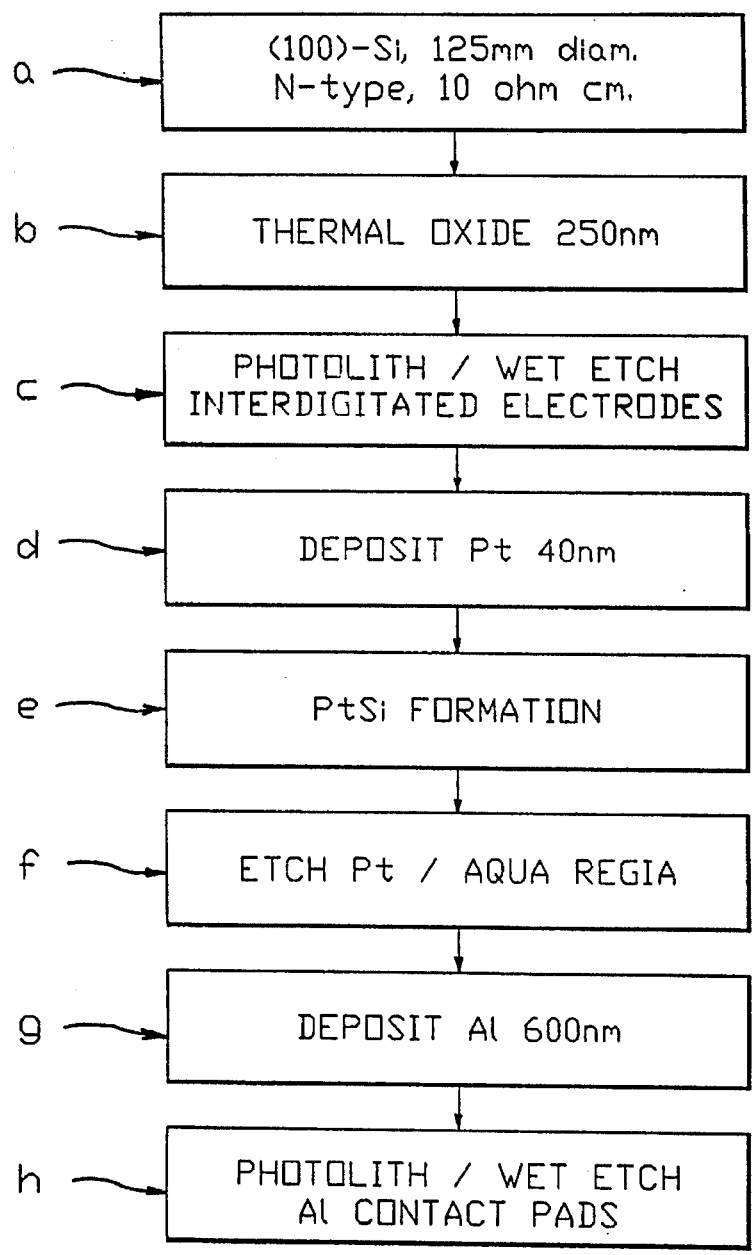
FIG. 3 is a flowchart of one process sequence for fabricating an MSM-PD in accordance with the invention using PtSi electrode metallurgy and $SiO_2$ passivation.

More specifically, the steps of one particular fabrication process are shown in flowchart form in FIG. 3. The details of the steps (a) through (h) are as follows.

Beginning with a silicon wafer of (100) orientation, 125 mm diameter, N-type, 5–10 ohm-cm (FIG. 3-(a)), a thermal oxidation process is applied to grow an $SiO_2$ film approximately 250 nm thick on the surface of the silicon wafer (FIG. 3-(b)).

By means of lithographic techniques an interdigitated finger pattern is delineated in a resist layer that is applied on the oxide surface. Approximately 80% of the thickness of the exposed, i.e., unprotected, oxide film is removed by etching, after which the resist is completely stripped off the surface and the wafer thoroughly cleaned. The remaining oxide film in the interdigitated pattern is then etched by dipping in a dilute aqueous solution of HF acid (FIG. 3-(c)) immediately prior to the evaporation of a platinum (Pt) film approximately 40 nm thick (FIG. 3-(d)).

The Pt film in contact with Si in the interdigitated pattern is transformed into PtSi (FIG. 3-(e)) by heating the wafer under rigorously controlled conditions of temperature, time, and gas atmosphere. The wafer is first heated at 250° C. for one hour in a totally oxygen-free inert gas such as pure nitrogen or argon. Immediately after, a second heat treatment is performed preferably in-situ, at a higher temperature between 3752 C. and 550° C. for 20 to 30 minutes in nitrogen or argon gas containing 10% oxygen. The concentration of oxygen in the gas atmosphere is approximate and could vary over a wide range. The dual temperature annealing process is important to achieving the quality of PtSi metallurgy that is required for good performance of the completed photodetector. At the lower temperature, Pt is converted completely to $Pt_2Si$ and in the absence of oxygen the detrimental effects of $SiO_2$ formation is avoided. At the next elevated temperature anneal the transformation of $Pt_2Si$ to PtSi proceeds readily given that the Pt is already bound with Si, and simultaneously a thin $SiO_2$ film is formed on the PtSi surface due to the presence of oxygen. The oxide on the PtSi is essential as it acts as a protective film for the PtSi fingers during the subsequent etching of unreacted Pt on the surface of the wafer. The unreacted free platinum is then etched selectively in a mixture of acids containing HCl and HNO$_3$ in a volume ratio of approximately 3:1 (FIG. 3-(f)). Without the oxide film on the PtSi finger electrodes, this acid mixture would attack PtSi and cause severe degradation of the Schottky barrier diode (SBD) junctions of the final device. The integrity of the PtSi metallurgy, which is determined by the annealing and etching conditions, affects the leakage current of the SBD's and hence the performance of the MSM photodetector. After etching the Pt film, an aluminum film (about 600 nm) is deposited on the wafer (FIG. 3-(g)) and again patterned by lithographic techniques to form electrical contact pads to the interdigitated electrodes (FIG. 3-(h)). The final oxide thickness of the completed device is adjusted to be approximately 150 nm to achieve desirable antireflective characterisitics of the surface of the device.

Figure 4:
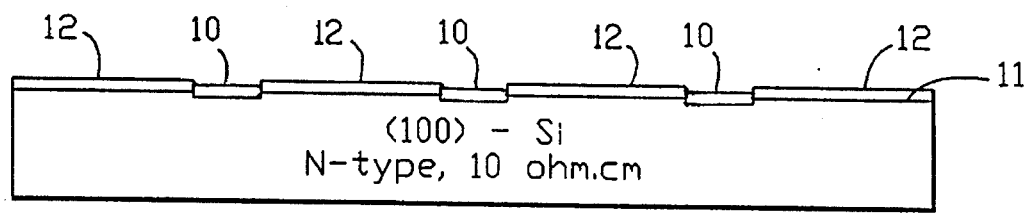
FIG. 4 is a cross-sectional view of a device made according to the process of FIG. 3 absent contact pads.

A representation of the resulting structure, prior to the deposition of the contact pads, is shown in section in FIG. 4, and it will be appreciated that only two lithographic masking levels are required to produce it. Also, it will be seen that this process advantageously involves:

1) the use of PtSi ($\phi_n$=0.86 V) to obtain a high barrier and hence low dark current device; 2) the use of a Self-ALigned-SilICIDE (SALICIDE) process to minimize process complexity and achieve a self-aligned structure;

3) the use of a thermal oxide passivated surface in the active area of the device to reduce surface recombination; and 4) the use of a low temperature process after metal deposition, permitting easy integration into current Bipolar and CMOS processes.

A depiction of the form of the device at successive steps in a preferred process applying the SALICIDE approach in fabricating an MSM-PD in accordance with the invention is illustrated in FIGS. 5(a) through 5(e). Starting with the surface 11 of a layer of silicon 1 on a substrate 2 (FIG. 5(a)), the method may be carried out simply in the following steps.

1. The exposed Si surface 11 is coated with a film 12 of thermally grown oxide, deposited oxide, or oxynitride, shown as SiO$_2$ in FIG. 5(b), such that the oxide/Si interface exhibits low surface recombination velocity.

2. An interdigitated pattern 13 is etched through the oxide film 12 by standard lithographic techniques (FIG. 5(c)).

3. Metal 14 (e.g., Pt) is deposited over the entire structure as seen in FIG. 5(d).

4. After annealing at elevated temperature to form PtSi 10, the unreacted Pt 14 on the oxide surface 12 is etched off, leaving the structure shown in FIG. 5(e).

Figure 5A:
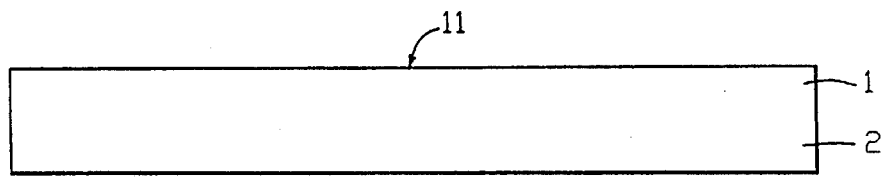
FIGS. 5(a) through 5(e) illustrate the forms of the device during the process stages of making an MSM photodetector of the form of FIG. 4 in accordance with the Salicide concept.
Figure 5B:
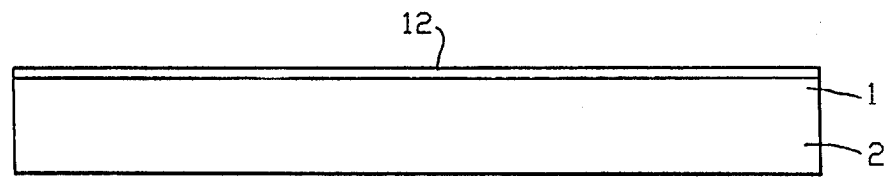
Figure 5C:
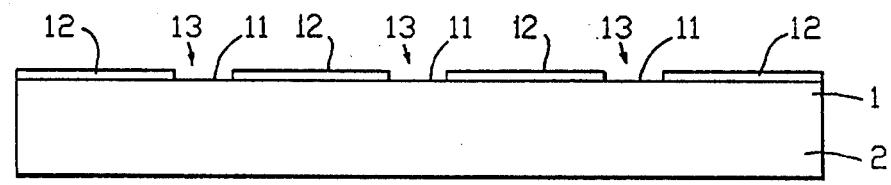
Figure 5D:
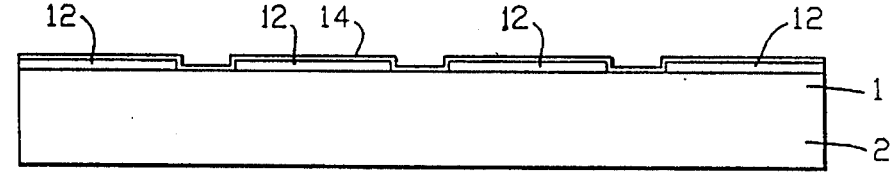
Figure 5E:
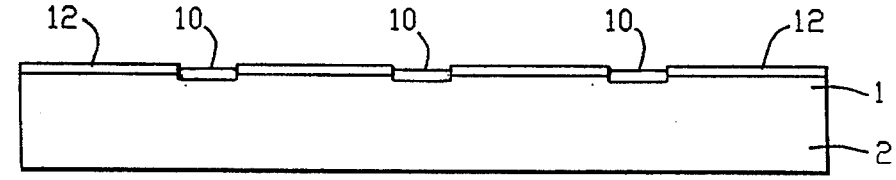
Figure 6A:
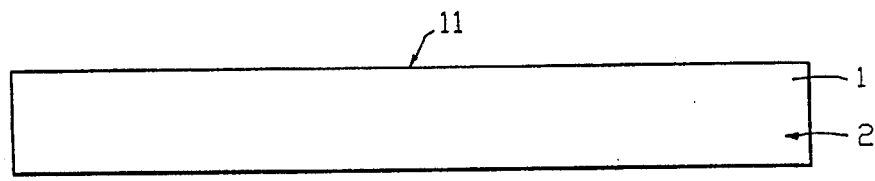
FIGS. 6(a) through 6(d) illustrate the forms of the device during the process stages of making an MSM photodetector of the form of FIG. 4 using an alternative metal deposition process.
Figure 6B:
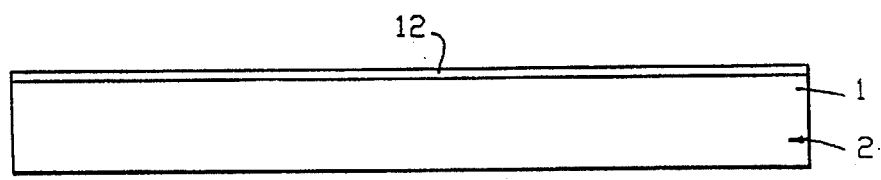
Figure 6C:
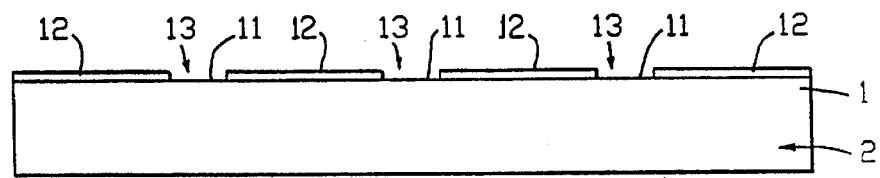
Figure 6D:
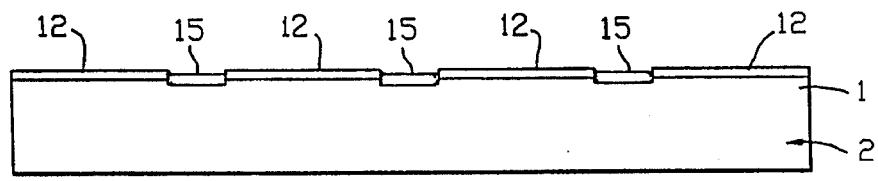

Alternatively, instead of depositing and etching the metal 14 in the manner of the steps of FIGS. 5(d) and 5(e), a selective deposition process such as illustrated in FIGS. 6(a) to 6(d) may be carried out. After following the same first three steps as in the foregoing SALICIDE procedure to arrive at the form of the device in FIG. 6(c), a metal (e.g., W or Ti) or metal silicide 15 may be selectively deposited as shown in FIG. 6(d) and reacted with the exposed portions of the silicon surface 11 in the patterned oxide 12 to form interdigitated silicide electrodes 10. Ultimately, separate metal contact pads are applied to the two sets of interdigitated electrodes by means of which an electric field is created between them.

Figure 7A:
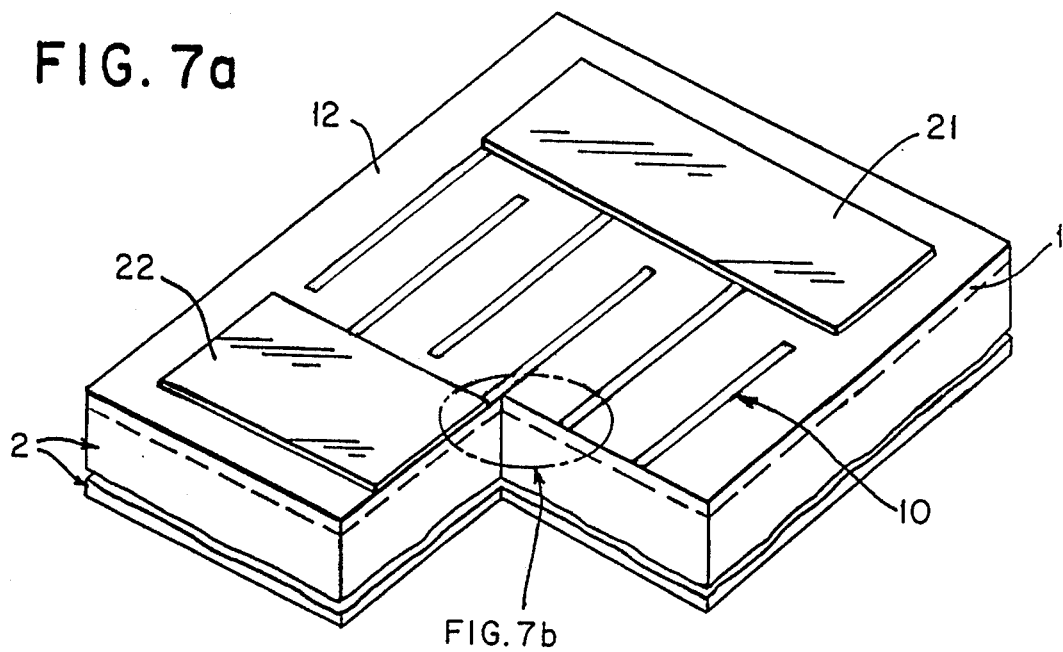
FIG. 7(a) is a perspective view in section showing a completed MSM photodetector in accordance with the invention and FIG. 7(b) is an enlarged view of a portion of the device of FIG. 7(a).
Figure 7B:
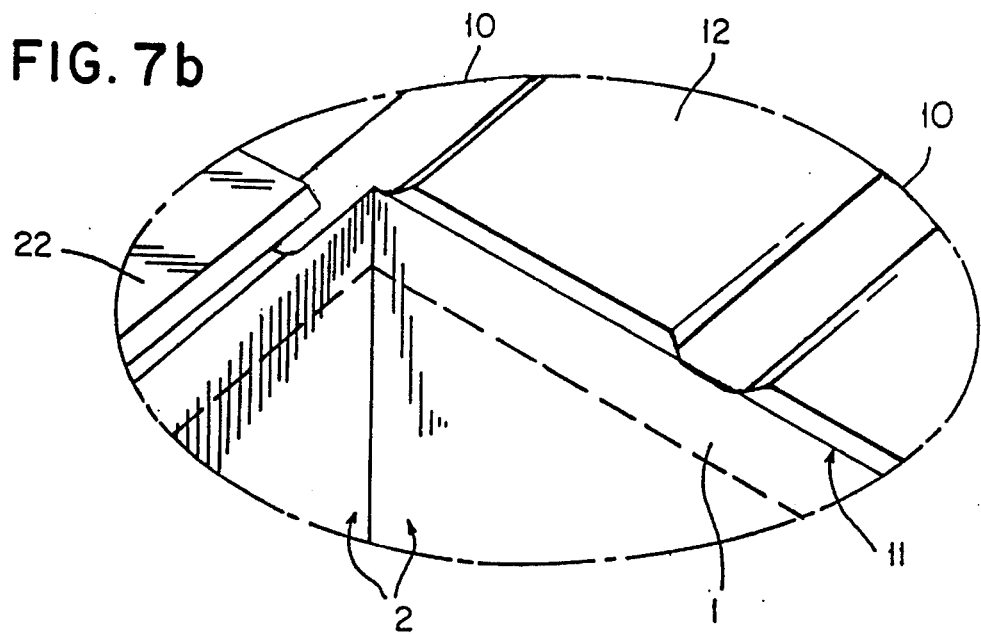

FIG. 7(a) is a perspective view in section showing a completed MSM photodetector in accordance with the invention and FIG. 7(b) is an enlarged view of a portion of the device of FIG. 7(a) showing the structure at the photoactive surface region 1.

A further feature of the invention directed to reducing the leakage current at the electrodes embodies the provision of suitable p+ and n+ implanted regions beneath the interdigitated electrode fingers in such a manner as to fabricate a lateral interdigitated p-i-n photodetector (LPIN-PD). The details of the typical steps required for the fabrication of the LPIN-PD are as follows.

After following the same first two steps described with regard to FIGS. 3(a) and 3(b), a first set of fingers is delineated by means of lithographic techniques in a resist layer that is applied on the oxide surface. The exposed, i.e., unprotected, oxide film is removed by etching. The resist is then completely stripped off the surface and the wafer thoroughly cleaned. Shallow n+ regions are formed by low energy ion implantation of elements like phosphorus (P), arsenic (As) or antimony (Sb).

A second set of fingers, interdigitated with the first set, is then delineated by means of lithographic techniques in a resist layer that is applied on the oxide surface. The exposed, i.e., unprotected, oxide film is removed by etching and shallow p+ regions are formed by low energy ion implantation of elements like boron (B), indium (In) or Gallium (Ga). The resist is then completely stripped off the surface and the wafer thoroughly cleaned. An annealing process is finally carried out at moderately high temperatures (900° C.) to electrically activate the implanted elements.

A depiction of the forms of the device at successive steps in a typical process for the fabrication of the p+ and n+ regions in accordance with the invention are illustrated in FIGS. 8(a) to 8(h). Starting with the surface 11 of a layer of silicon 1 on a substrate 2 (FIG. 8(a)), the fabrication may be carried out simply in the following manner.

Figure 8A:
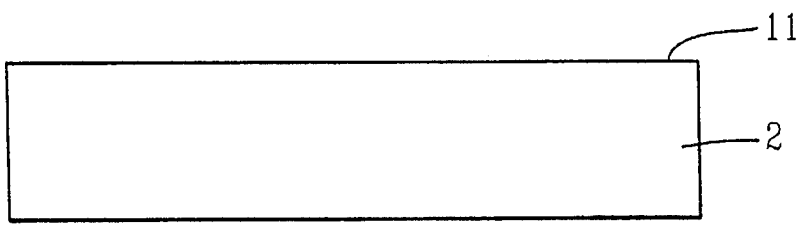
FIGS. 8(a) through 8(h) illustrate the forms of the device during the process stages of making a lateral interdigitated p-i-n photodetector.
Figure 8B:
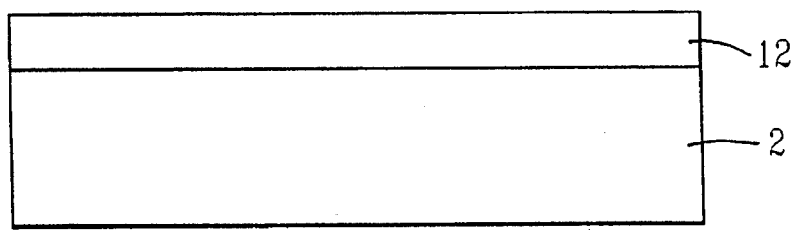
Figure 8C:
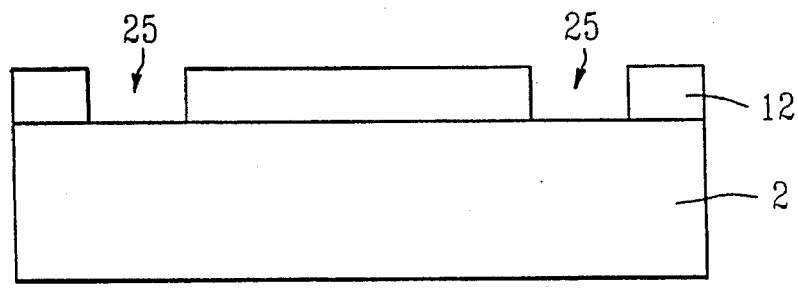

1. The exposed Si surface 11 is coated with a film 12 of thermal or CVD silicon dioxide as shown in FIG. 8(b);

2. A first set of fingers 25 is etched through the silicon dioxide 12 by standard lithographic techniques leaving the configuration shown in FIG. 8(c).

Figure 8D:
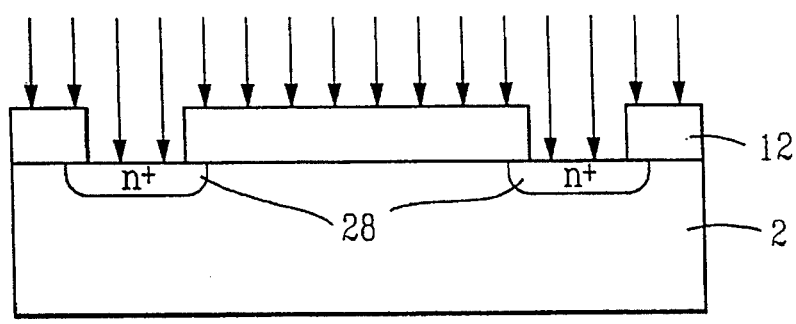

3. Shallow n+ regions 28 are formed by ion implantation as shown in FIG. 8(d).

Figure 8E:
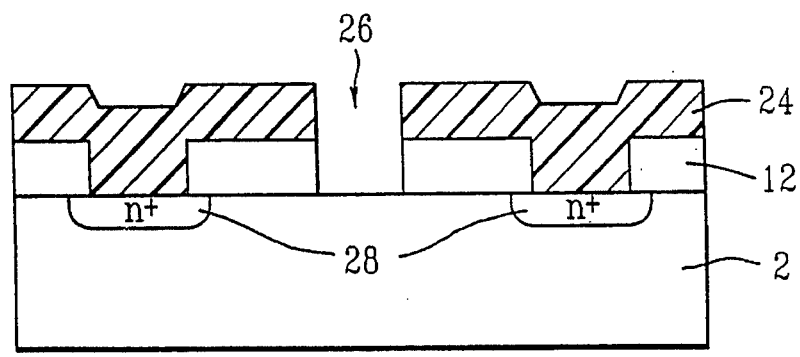

4. A second set of fingers 26, interdigitated with the first set, is then etched through the silicon dioxide 12 by standard lithographic techniques leaving the configuration as shown in FIG. 8(e). The photoresist 24 is not removed here, in order to protect the silicon regions exposed for the n-type implantations.

Figure 8F:
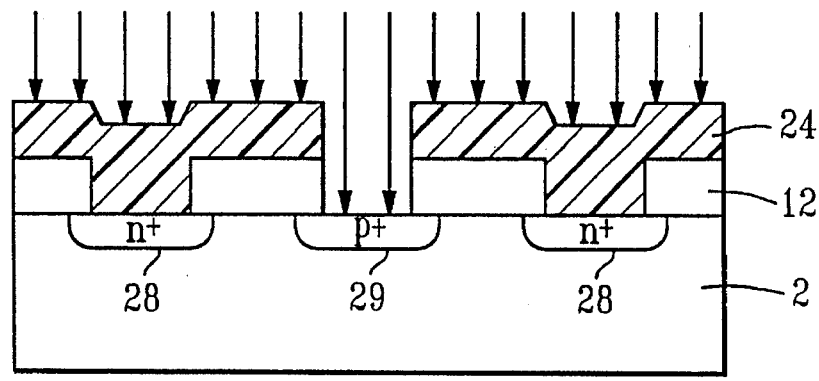
Figure 8G:
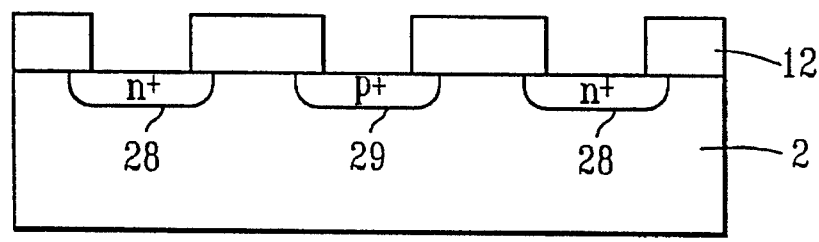

5. Shallow p+ regions 29 are then formed by ion implantation as shown in FIG. 8(f) and the photoresist 24 is stripped off the surface leaving the structure shown in FIG. 8(g).

Figure 8H:
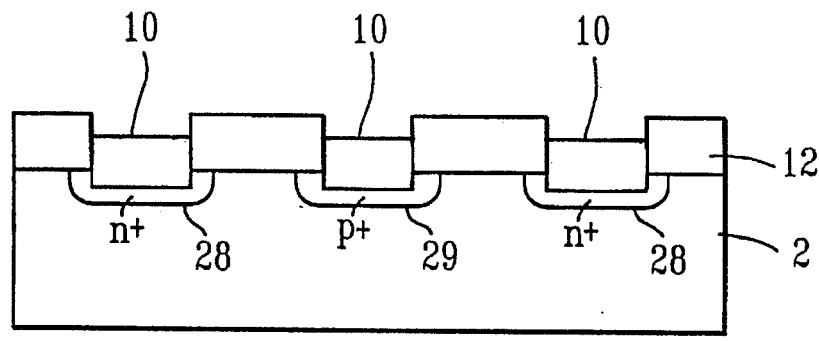

The photodetector fabrication process may then be completed following the last five steps illustrated in FIGS. 3(d) to 3(h), in order to provide metal or silicide contacts to the p+ and n+ regions and aluminum pad contacts to the electrodes. A representation of the resulting structure, prior to the deposition of the contact pads, is shown in FIG. 8(h). In this embodiment the electrode material need not be one with a high electron and hole barrier height to silicon since ohmic contacts are made between the sets of electrodes and the sets of n+ and p+ regions.

Alternatively, the n+ and p+ regions may be formed by diffusion of dopants from previously deposited and patterned layers of n-doped and p-doped polysilicon. Although the LPIN fabrication process is more complicated than the MSM process, it does not set any limitation on the compatibility with VLSI technology (CMOS technology in particular). Both p an n-type implantations are in fact widely used in CMOS technology for the fabrication of the P and N channel MOS devices. Diffusion of dopants from polysilicon is also widely used in VLSI bipolar technology to form the shallow emitters and bases of PNP and NPN transistors.

Irrespective of which of the foregoing processes are used, it is preferred that the oxide 12 be a high-quality transparent silicon dioxide film that protects and passivates the photoactive silicon surface region 1 of the photodetector between the interdigitated electrodes 10. Although interdigital capacitance is increased by the oxide, it also tends to be decreased by the use of the thin metal electrodes recessed below the silicon surface, which itself may be on a comparatively thin layer, and the entire process and structure are compatible with conventional silicon integrated circuit technology.

An additional feature of the invention involves the reduction of the excessive leakage current due to edge effects by passivating the silicon surface with a semi-recessed or fully-recessed silicon dioxide layer. More particularly, the semi- or fully-recessed oxide is a thermally grown silicon dioxide designed in such a manner that the silicon dioxide/silicon interface is recessed below the metal/silicon interface, thus performing one or both of the following functions:

(1) the reduction of the electric field strength at the edges of the electrode fingers; and (2) the reduction of the sidewall area of the silicide fingers.

Both of the aforementioned functions result in a reduction of the excessive leakage current that affects the MSM-PDs due to tunneling and barrier-lowering phenomena. They also contribute to avoiding avalanche multiplication effects near the finger edges of both MSM and LPIN structures.

The details of typical steps required for the fabrication of the semi-recessed oxide (SEMIROX) are as follows.

Beginning with a silicon wafer of (100) orientation, 125 mm diameter, N-type, a "buffer" $SiO_2$ film approximately 20 nm to 60 nm thick is thermally grown or chemically vapor deposited (CVD) on the surface of the silicon wafer. The function of this layer is to cushion the transition of stresses between the silicon substrate and the subsequently deposited silicon nitride.

A layer of silicon nitride ($Si_3N_4$) approximately 100 nm to 200 nm thick is then chemically vapor deposited on the silicon dioxide.

By means of lithographic techniques an interdigitated finger pattern is delineated in a resist layer that is applied on the silicon nitride surface. The resist pattern is such as to protect the areas where the metal fingers will be formed. The exposed, i.e., unprotected $SiO_2/Si_3N_4$ stack is removed by Reactive Ion Etching (RIE), after which the resist is completely stripped off the surface and the wafer thoroughly cleaned.

A thermal oxidation process is applied to grow the passivating oxide to the desired thickness. $Si_3N_4$ acts as an oxidation barrier, so that the oxide is grown in the exposed areas only. The volume of the thermally grown $SiO_2$ is about twice the volume of the silicon consumed in forming the oxide. The $SiO_2$ film thickness is thus approximately equally divided above and below the original silicon surface, preferably, 55.7% and 44.3% respectively, to yield a semi-recessed oxide structure.

The silicon nitride film is then stripped and over-etched in boiling ($\simeq 180°$ C.) phosphoric acid. Since 20 to 30 nm of the top of the nitride is converted to $SiO_2$ during the field oxidation, this layer must be etched first in hydrofluoric acid. Ultimately, the buffer oxide is stripped and over-etched in hydrofluoric acid in order to expose the silicon surface and allow the foregoing SALICIDE or selective deposition processes to be carried out. A depiction of the form of the device at successive steps in a preferred process applying the SEMIROX approach in fabricating an MSM-PD in accordance with the invention is illustrated in FIGS. 9(a) through 9(e). Starting with the surface 11 of a layer of silicon 1 on a substrate 2 (FIG. 9(a)), the fabrication may be carried out simply in the following manner.

Figure 9A:
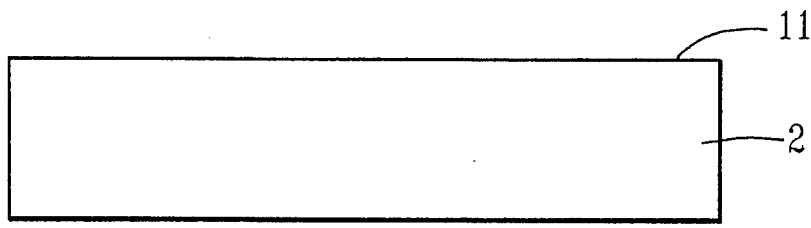
FIGS. 9(a) through 9(e) illustrate the forms of the device during the process stages of making a semi-recessed oxide (SEMIROX).
Figure 9B:
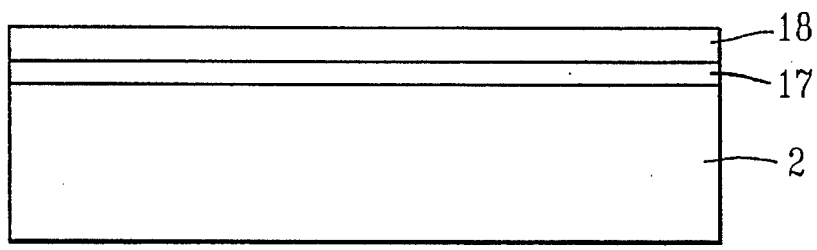
Figure 9C:
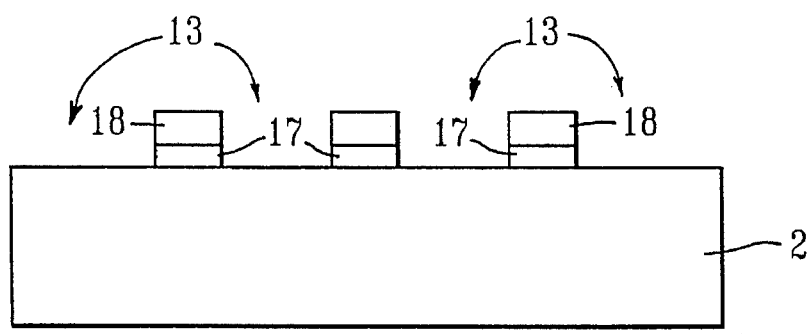
Figure 9D:
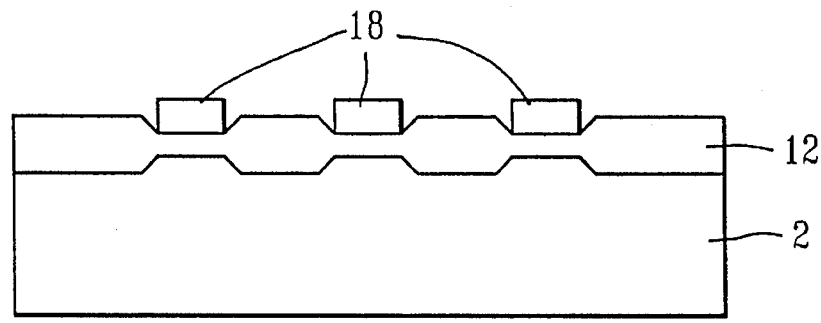
Figure 9E:
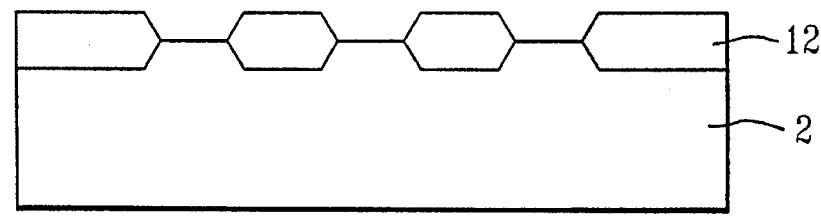

1. The exposed Si surface 11 is coated with a film 17 of thermal or CVD silicon dioxide which is coated with a film 18 of CVD silicon nitride as shown in FIG. 9(b);
2. An interdigitated pattern 13 is etched through the silicon dioxide 17/silicon nitride 18 stack by standard lithographic techniques (FIG. 9(c)).
3. A passivating oxide 12 is thermally grown as seen in FIG. 9(d).
4. The remaining $Si_3N_4$ film 18 and the $SiO_2$ film 17 are etched off, leaving the SEMIROX structure shown in FIG. 9(e).

Figure 10:
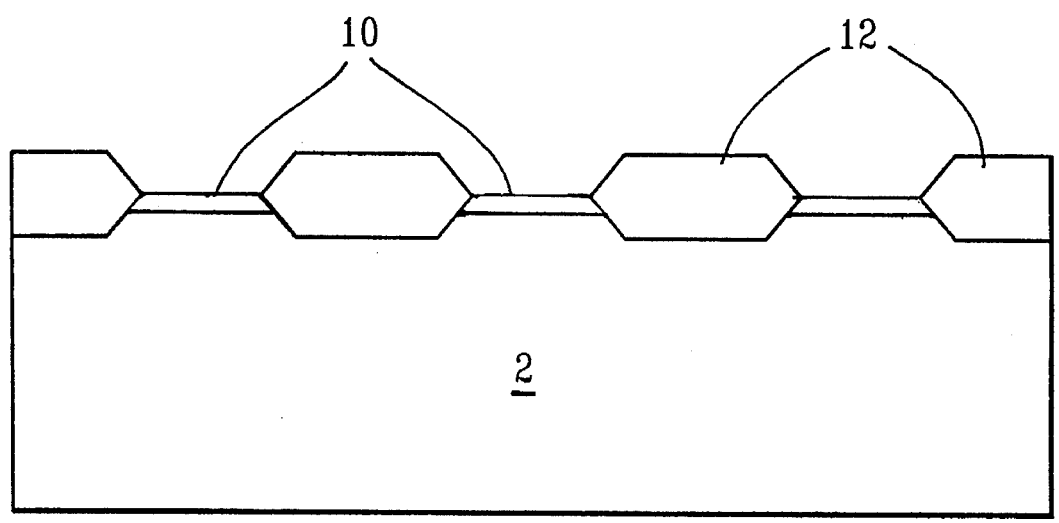
FIG. 10 is a schematic view in section of a portion of an MSM detector including a semi-recessed passivating silicon dioxide.

The photodetector fabrication process may then be completed following the last five steps illustrated in FIGS. 3(d) to 3(h). A representation of the resulting structure, prior to the deposition of the contact pads, is shown in FIG. 10.

Alternatively, instead of growing a semi-recessed oxide in the manner of the step of FIG. 8(d), a fully-recessed oxide (ROX) process such as illustrated in FIGS. 11(a) to 11(f) may be carried out.

Figure 11A:
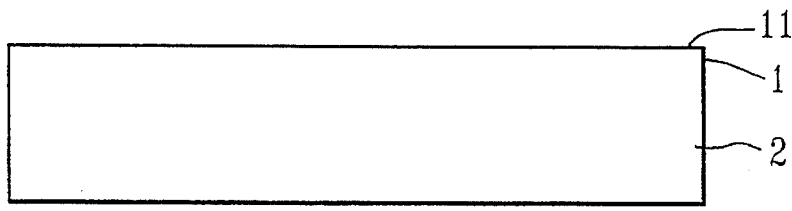
FIGS. 11(a) through 11(f) illustrate the forms of the device during the process stages of making a fully-recessed oxide (ROX).
Figure 11B:
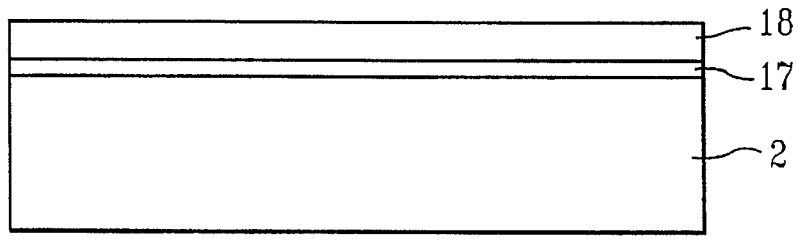
Figure 11C:
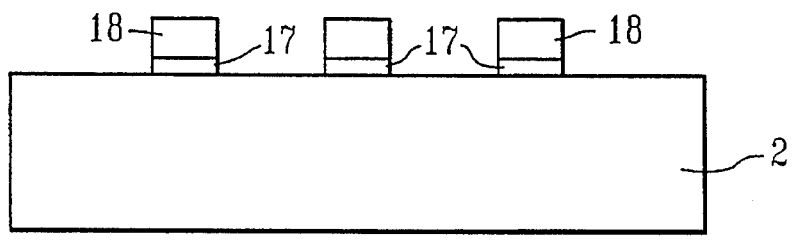
Figure 11D:
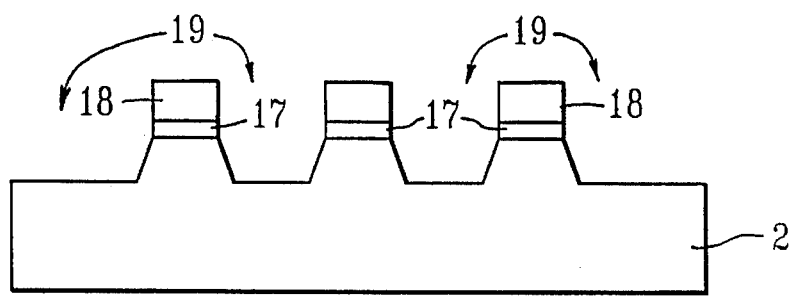

After following the same first three steps as in the foregoing SEMIROX procedure to arrive at the form of the device in FIG. 11(c), part of the exposed silicon surface 11 may be removed by means of reactive ion etching or an anisotropic etchant such as KOH, in order to create the interdigitated pattern of grooves 19 shown in FIG. 11(d). The depth of the grooves must be approximately half of the final thickness of the passivating layer 12.

Figure 11E:
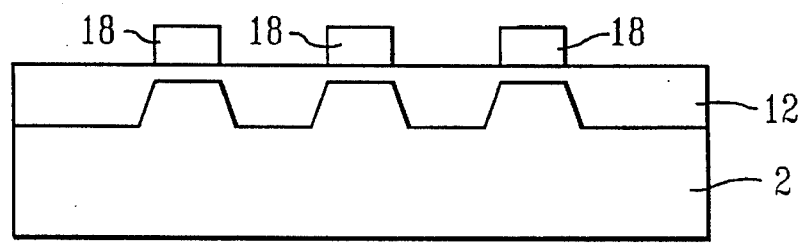
Figure 11F:
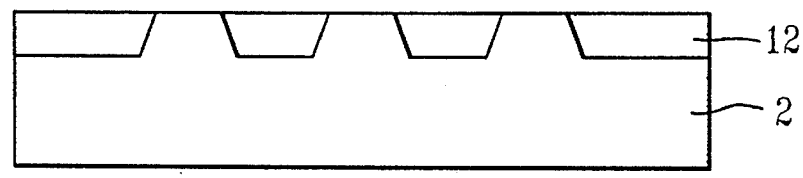

A passivating oxide 12 is then thermally grown in order to fill the grooves 19 (FIG. 11(e)). Ultimately, the silicon nitride film 18 and the pad oxide 17 are etched off, leaving the ROX structure shown in FIG. 11(f).

Both the SEMIROX and the ROX processes are generally carried out in such a manner that:

(1) the interdigital capacitance is not increased; and
(2) no extra masks are required.

Further in accordance with the invention, the thickness of the transparent oxide film 12 may be adjusted to act as an antireflective film at the desired wavelength of operation. As an example, to achieve best performance at an operating wavelength of 600 nm and a film of refractive index 1.5, the film thickness T should be one of the following: 100 nm, 300 nm, 500 nm, 700 nm, 900 nm, etc., as derived from the relationship $T=600(2k+1)/6$, where $K=0,1,2,3,4$, etc.

Figure 12:
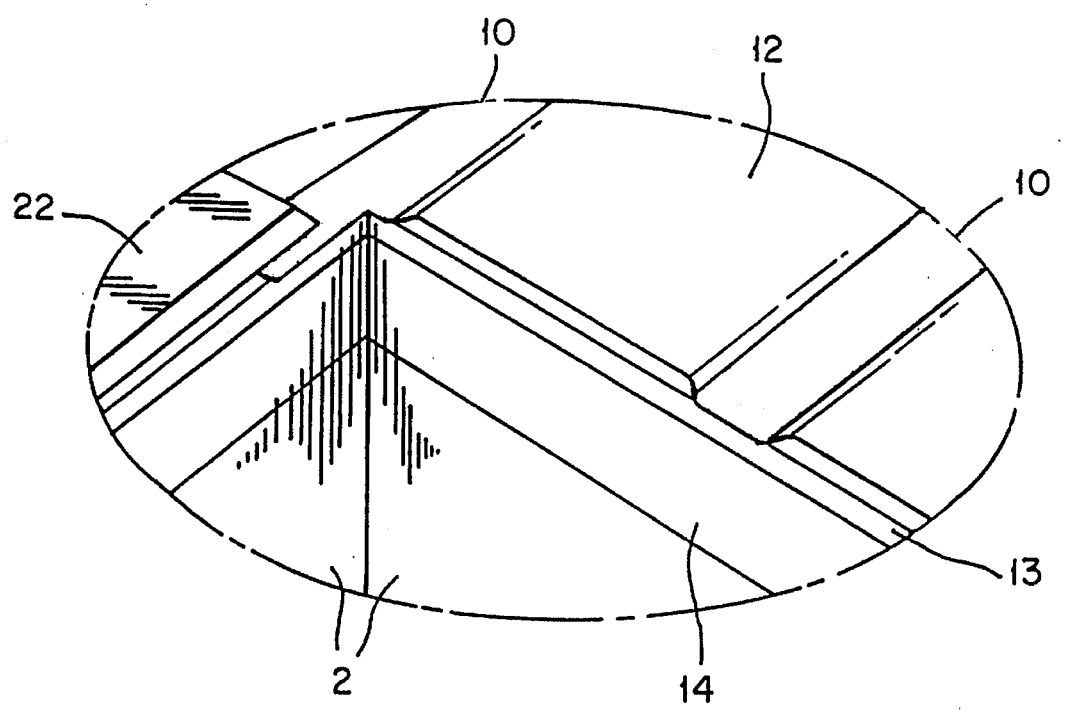
FIG. 12 is a perspective view in section of a portion of an MSM photodetector such as shown in FIG. 7(b) including a photoactive region in the form of a layer of Si-Ge alloy, with the alloy overcoated with a thin passivating layer of single crystal Si.

An additional feature of the invention involves extending the spectral sensitivity of the silicon of the photoactive surface region by incorporating Ge into the Si. For instance, as illustrated in FIG. 12, a layer of Si-Ge alloy 14, approximately 1 μm to 3 μm thick, may be grown epitaxially on the surface of the substrate 2. The alloy is overcoated with a thin layer of single crystal Si 13, approximately 0.25 μm thick, to form a high-quality passivating film over the photoactive Si-Ge layer when coated with the oxide layer 12. The composition of the Si-Ge photoactive surface layer 14, i.e., $Si_{1-x}Ge_x (0<x<1)$, can be adjusted to contain an amount of germanium that varies from 0% to 100% Ge. By virtue of the greater optical absorption of Ge at long wavelengths, the photosensitivity of the Si-Ge layer can thus be extended to a wavelength of 850 nm (about 20% to 30% Ge) and beyond up to about 1.8 μm.

The addition of Ge to Si has the first advantage of increasing the speed of the device at short wavelengths due to the diminished penetration depth of impinging photons in this material. By adjusting the Si-Ge composition, carrier generation is confined very close to the surface of the device where the electric field is most intense. This has the desirable effect of increasing the photoresponse speed of the detector because carriers that might otherwise be generated at large distances from the electric field at the surface do not materialize. Thus, the advantageous adjusting of the material composition and structure of the surface of the detector offers enhancement of the performance and the stability of the photodetector, while facilitating the integration of silicon MSM detectors into standard silicon VLSI fabrication methods.

Further features of the present invention directed to dealing with the problem of the penetration depth of impinging photons by the use of a barrier layer will be described hereinafter. Presently, however, some actual embodiments of devices constructed in accordance with the above-noted features of the invention will be described.

By way of specific examples of the application of the invention, a number of high bandwidth Si MSM-PDs have been fabricated using a self-aligned PtSi Schottky barrier metallurgy with $SiO_2$ passivation in a VLSI-compatible process such as that detailed with regard to FIG. 3. N-type substrates with resistivities of 2–15 ohm-cm were used to fabricate the PtSi Schottky barriers in the self aligned process. Linewidths were kept constant at 1 μm while finger spacings were varied from 1 μm to 7 μm. These detectors, which are optimal for high speed applications at wavelengths <700 nm, have been found to show a classic Si spectral response, with a measured 3 dB cutoff frequency in excess of 1.1 GHz. at 630 nm excitation, and a responsivity in excess of 0.3 A/W, for a finger spacing of 1.6 μm and a total device area of 6375 μm² of which 50% was active.

Table I summarizes the key device geometric parameters of seven MSM interdigitated structures with PtSi electrode gaps ranging from 0.6 to 6.6 μm with a constant electrode width of 1.4 μm.

TABLE I

Geometry of MSM photodetectors.
PtSi electrode width
1.4 μm for all devices.
Constant device area 85 × 75 μm².

| Device # | Electrodes Total | Gap μm | Electrode Area μm² | Active Area % |
|---|---|---|---|---|
| 1 | 37 | 0.6 | 4303 | 32 |
| 2 | 25 | 1.6 | 3200 | 50 |
| 3 | 19 | 2.6 | 2612 | 59 |
| 4 | 15 | 3.6 | 2220 | 65 |
| 5 | 13 | 4.6 | 2024 | 68 |
| 6 | 11 | 5.6 | 1828 | 71 |
| 7 | 10 | 6.6 | 1730 | 73 |

Optimal MSM-PD design requires the absorption depth, interdigital spacing, and depletion depth to be comparable. The absorption depth for silicon increases from below 500 nm at a wavelength of 400 nm to over 10 μm at a wavelength of 850 μnm. The absorption depth for silicon may be decreased at wavelengths ≦850 nm by incorporating germanium into silicon to the extent of 0 to 100%. In the fabricated devices, the absorption depth in Si is approximately 3 μm at the 630 nm wavelength that was selected for measurement purposes.

Figure 13:
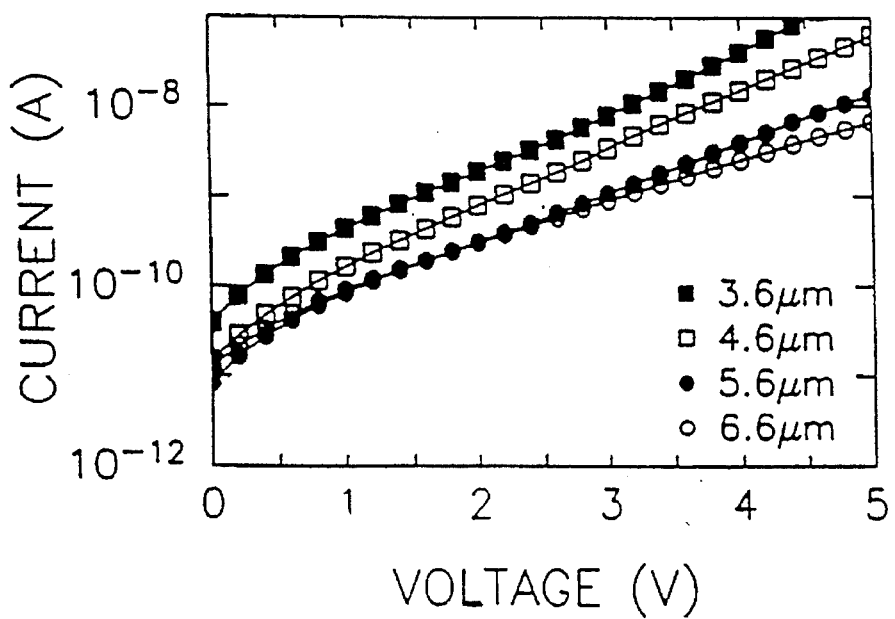
FIG. 13 shows the dc characteristics for MSM-PDs with different finger spacings, i.e., 3.6 µm to 6.6 µm.
Figure 14:
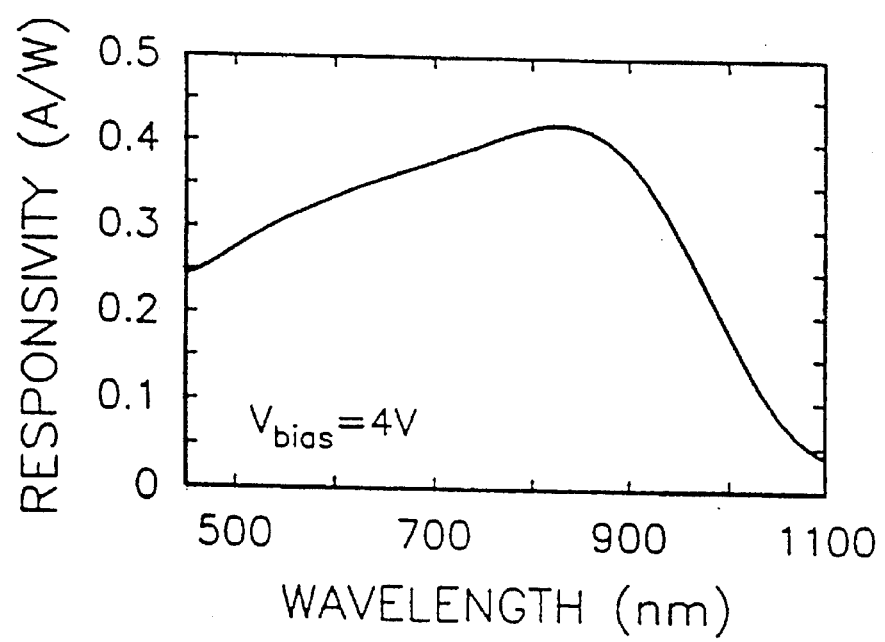
FIG. 14 is a plot of the dc spectral response of a device with a 6.6 µm finger spacing at 4 V bias obtained using a scanning monochromator having a white light source and indicating that the maximum dc responsivity at 850 nm is about 0.42 A/W.
Figure 15:
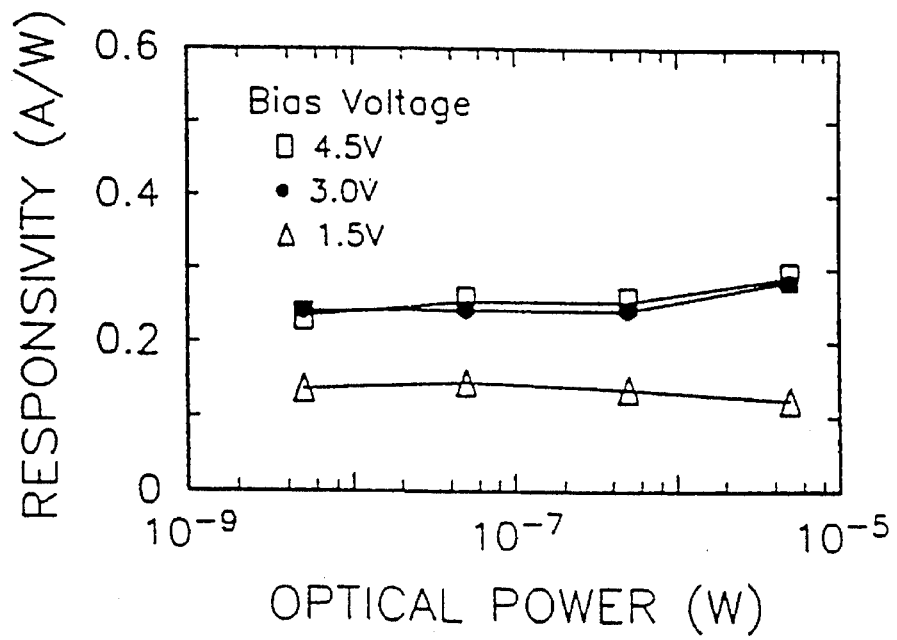
FIG. 15 is a plot of the dc responsivity of a device with 3.6 µm finger spacing at 633 nm for varying voltages.

The electrical and optical behavior of the fabricated devices were measured and tested and FIGS. 13 to 18 show various characteristics of these fabricated devices. FIG. 13 shows the dc characteristics for MSM-PDs with different finger spacings. The characteristics are symmetric and the dark current increases with total silicided area. The devices with the smallest spacings exhibit higher dark currents. DLTS measurements show no evidence of deep levels within the depletion region. FIG. 14 shows the dc spectral response of a device with a 6 μm finger spacing at 4 V bias. This measurement was obtained using a scanning monochromator having a white light source. The maximum dc responsivity at 633 nm is about 0.42 A/W. The dc responsivity with respect to optical power at 633 nm for varying voltages and an electrode spacing of 3.6 μm is shown in FIG. 15.

Figure 16:
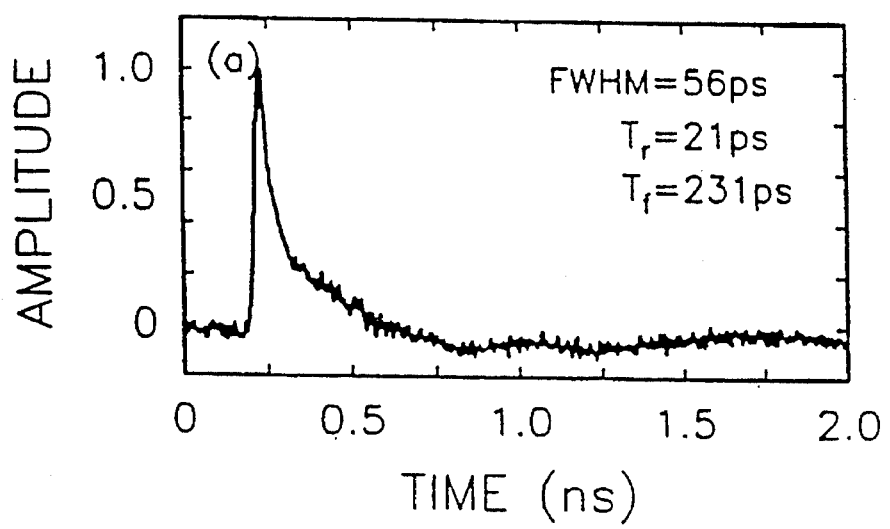
FIG. 16 illustrates a typical impulse response of a device with 1.6 µm finger spacing at 630 nm and 5 V bias voltage.
Figure 17:
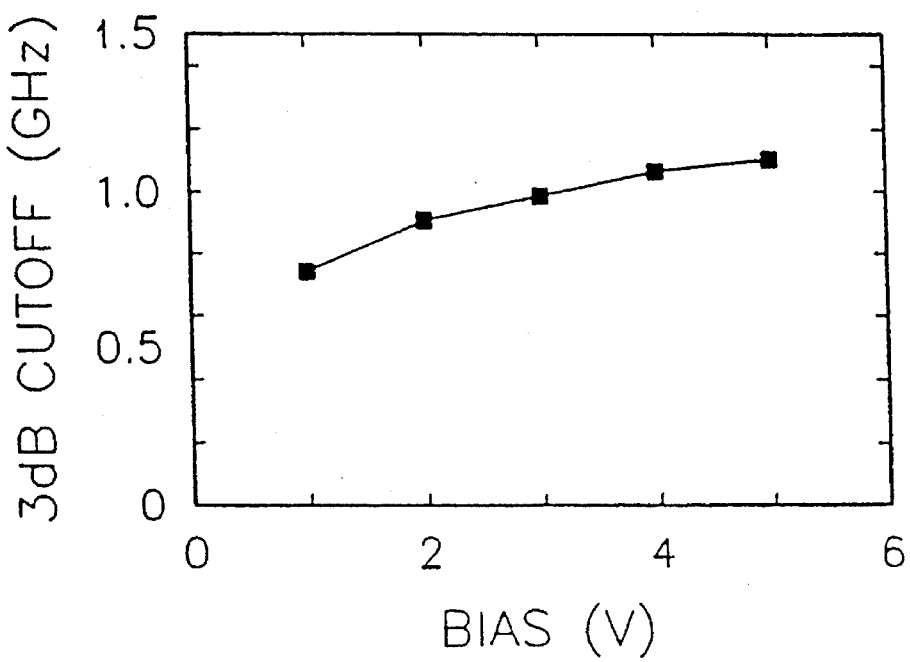
FIG. 17 is a plot of the 3 dB bandwidth at 530 nm as a function of bias for the 1.6 µm devices fabricated on a 5 ohm-cm substrate and showing the 3 dB bandwidth saturates at 1.1 GHz.
Figure 18:
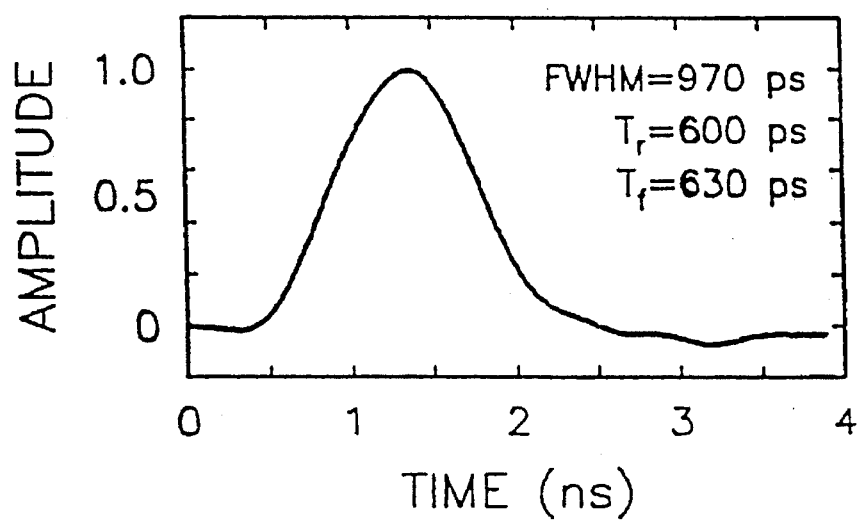
FIG. 18 illustrates a typical impulse response of a device with 2.6 µm finger spacing at 532 nm and 2 V bias voltage obtained by wire-bonding the device to a transimpedance amplifier.

Time domain response measurements were performed at wavelengths of 532 nm and 630 nm using pulsed lasers. The pulse width and repetition rates were 2 ps at 100 MHz and 0.3 ps at 76 MHz respectively. FIG. 16 shows a typical impulse response. This result was obtained on a device having a 1.6 μm finger spacing fabricated on an 11 ohm-cm substrate at 5 V bias. An average power of 100 μW at 630 nm was used. The corresponding frequency response, has a 3 dB electrical bandwidth of 1.1 GHz. FIG. 17 shows the 3 dB electrical bandwidth at 630 nm as a function of bias voltage for a device fabricated on a 5 ohm-cm substrate with a 1.6 μm electrode spacing. FIG. 18 shows the time domain response of an Si MSM-PD with a 2.6 μm finger spacing at a wavelength of 532 nm coupled to a transimpedance amplifier with the detector biased at 2.0 V.

Figure 19:
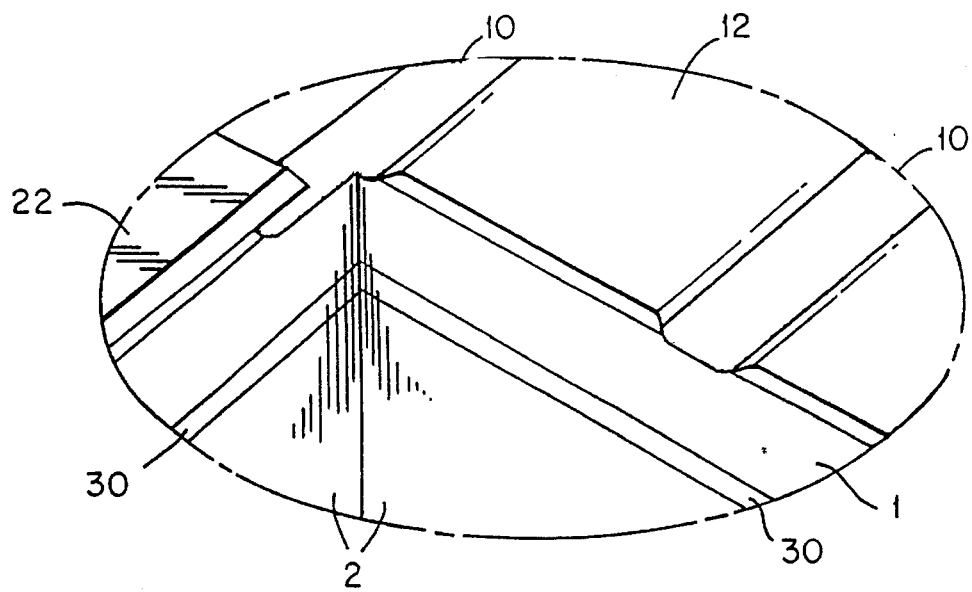
FIG. 19 is a perspective view in section of a portion of an MSM photodetector such as shown in FIG. 7(b) including a barrier layer beneath the photoactive region.

Turning now to the above-mentioned further features of the present invention directed to dealing with the problem of the penetration depth of impinging photons and more particularly to overcoming the problem posed by longer wavelength light generating carriers deep within the semiconductor, beyond the influence of the electric field of the interdigitated surface electrodes and thus slow to be collected and slowing down the photoresponse of the detector. To this end, as seen in FIG. 19, the photoactive semiconductor surface layer 1, e.g., approximately 1 μm to 3 μm thick, is separated from the silicon substrate 2 by a buried barrier layer 30, the purpose of which is to isolate electrically and/or optically the photoactive layer 1 from the substrate 2. More specifically, the barrier layer may take various forms designed to perform one or more of the following functions:

(1) as an optically transparent and non-reflecting layer 31 (FIG. 20), which is also electrically insulating, e.g, silicon dioxide, silicon nitride, silicon oxynitride, glasses and the like;

(2) as an optically opaque or absorbing layer 32 (FIG. 21), such as very heavily doped N-type or P-type Si and doped Si-Ge alloys; and (3) as an optically reflecting layer 33 (FIG. 22), consisting of one or more thin films of, e.g., silicon dioxide or silicon nitride, which films effectively form a dielectric mirror.

In such a truncated structure where the device region at the surface 11 is separated from the underlying substrate 2 by a barrier layer 30, only electron-hole pairs, i.e., charge carriers that are generated in the photoactive surface layer 1 within the influence of the electric field (see FIG. 2) contribute to the photoresponse of the detector. Such confinement which limits the range or path of the carriers to the active region 1 results in a considerable enhancement of the photoresponse speed of the detector.

For the sake of simplicity, all the structures disclosed below will be described with reference to an MSM photodetector. It should be understood, however, that the same structures make possible improvement of the photoresponse speed of LPIN photodetectors as well when applied thereto. In fact, the improvement is based on the presence of the buried barrier layer and does not depend on whether the photodetector structure is an MSM or LPIN.

Figure 20:
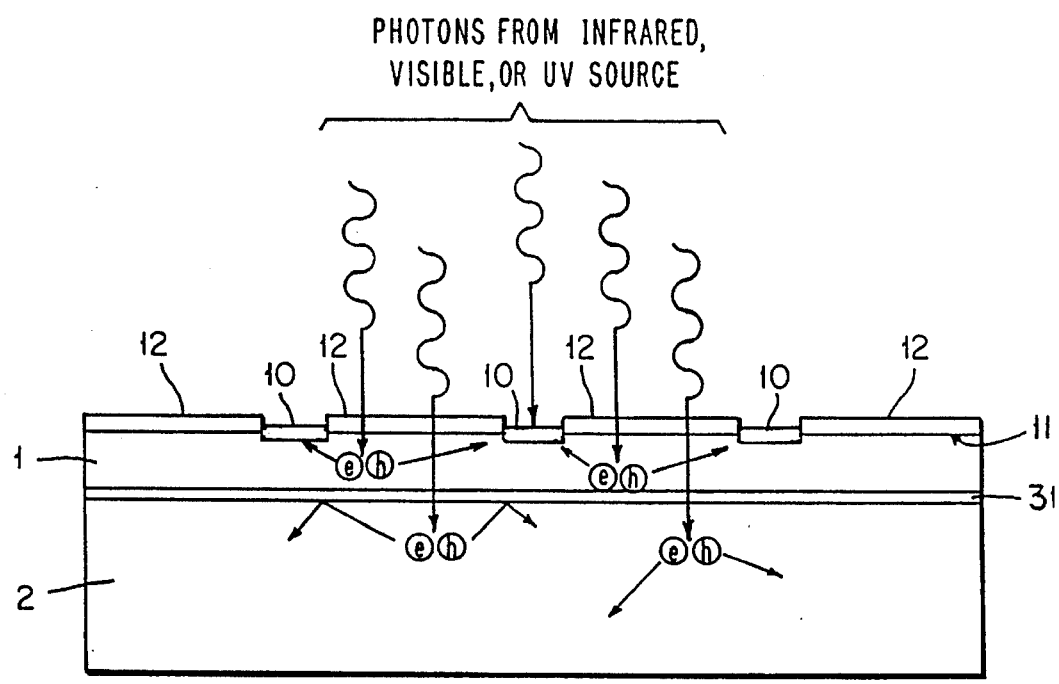
FIG. 20 is a schematic view in section of an MSM photodetector such as shown in FIG. 2, including a transparent barrier layer beneath the photoactive region of the type shown in FIG. 19, and illustrating the action of the layer on incident-light-generated charge carriers.

More particularly, as illustrated in FIG. 20, the barrier layer 31 that isolates the MSM device active region 1 from the supporting substrate 2 can be an optically transparent but electrically insulating material, such as silicon dioxide or silicon nitride. The thickness of the insulating layer 31 is preferably designed in such a manner as to avoid any optical reflections at the interfaces between the layer 31 and the active region 1 or the substrate 2. To this end, both the active layer 1 and the substrate 2 should have the same refractive index and the optical thickness of the transparent layer 31 should be equal to an integer multiple of half of the the operating wavelength, i.e., $0.5\lambda$, $\lambda$, $1.5\lambda$, etc., where $\lambda$ is the wavelength of operation. In such a structure, photons that are absorbed in the photoactive surface region above the buried barrier are collected by the field and thus contribute to the response of the detector. Photons that are transmitted through the transparent barrier also generate photocarriers deep in the substrate. These carriers however cannot reach the surface because they are blocked by the insulating barrier and therefore recombine before they can be collected by the field and do not contribute to the photoresponse of the detector.

A buried oxide or nitride layer may be formed by ion implantation of oxygen or nitrogen. Similar truncated structures may be fabricated on silicon-on-insulator (SOI) substrates which are well-known in silicon IC technology. Other contemplated structures include heteroepitaxial structures that are formed by growing non-silicon materials epitaxially on a silicon substrate.

Figure 21:
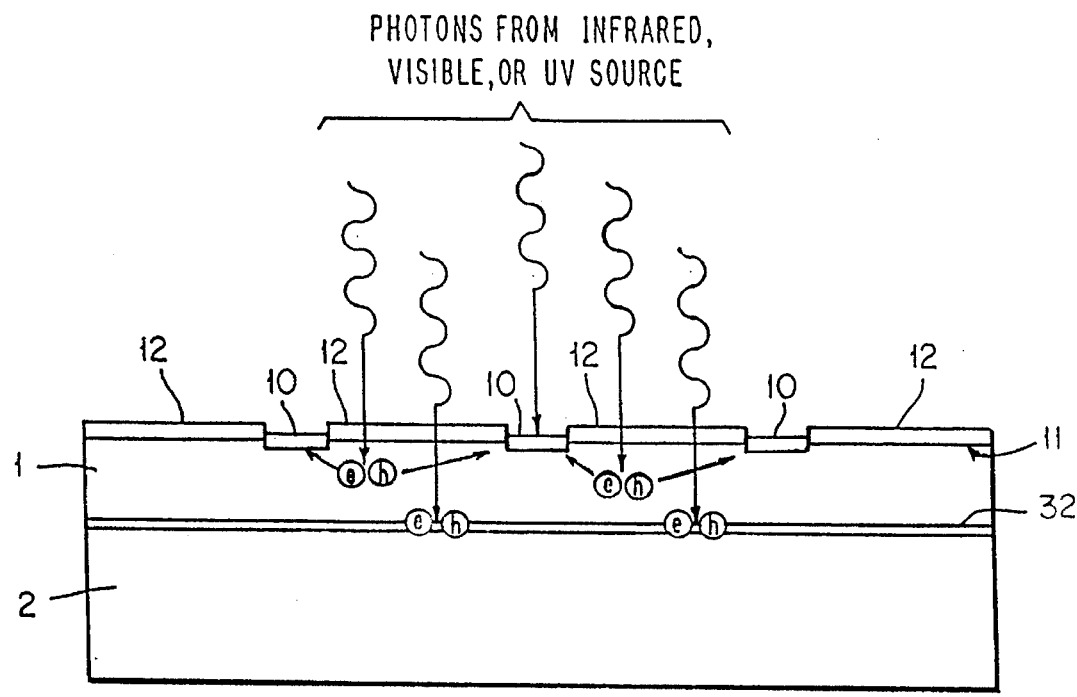
FIG. 21 is a schematic view in section of an MSM photodetector such as shown in FIG. 2 including an absorption or recombination barrier layer beneath the photoactive region of the type shown in FIG. 19, and illustrating the action of the layer on incident-light-generated charge carriers.

Alternatively, as illustrated in FIG. 21, an optically absorbing barrier layer 32 buried below the photoactive surface region 1 can also isolate the MSM device at the surface 11 from the underlying substrate 2. Only photons absorbed in the photoactive surface region are able to generate carriers which are collected by the electric field and therefore contribute to the photoresponse of the detector. Photons which reach the opaque barrier layer generate carriers which recombine very rapidly before they are collected by the field. A heavily doped N+ or P+ Si layer is an example of an optically absorbing barrier which may be formed by conventional ion implantation, or epitaxial methods which are well-known in the silicon IC industry. The doping of the silicon layers must be sufficiently high to ensure that carrier (i.e., electrons and holes) lifetime is extremely short and that recombination occurs before the carriers are separated and collected by the field. This barrier layer feature may be implemented when making the MSM-PD on a substrate with a heavily doped N+, or P+ buried layer. The buried doped layer can be formed by ion implantation or by epitaxy and in both structures the desired thickness of the top semiconducting layer 1 can be increased by epitaxy or decreased by controlled etching.

A possible disadvantage of the two aforementioned structures, where the active absorption region is confined by the use of a non-reflecting transparent or absorbing barrier layer, is a reduced Quantum Efficiency (QE) that results in a low detector responsivity. For example, only 20% of the impinging photons are absorbed within a 2 µm thick active layer at 780 nm wavelength.

Figure 22:
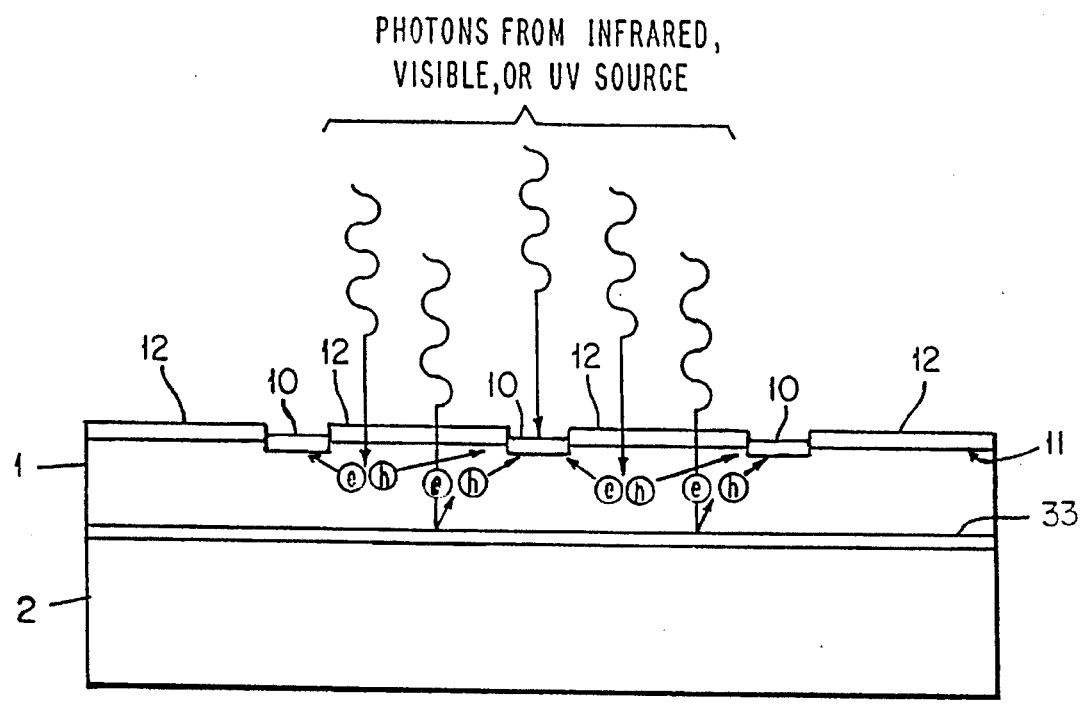
FIG. 22 is a schematic view in section of an MSM photodetector such as shown in FIG. 2 including a reflective barrier layer beneath the photoactive region of the type shown in FIG. 19, and illustrating the action of the layer on incident-light-generated charge carriers.

This intrinsic limitation may be overcome by exploiting the structure illustrated in FIG. 22, where a buried barrier layer 33, which acts as a reflective medium to photons, consisting of one or more thin films of dielectric material, such as silicon dioxide or silicon nitride, is positioned between the photoactive surface region 1 of the MSM structure and the substrate 2. The sandwich composed of the top (passivating) layer 12, the silicon active layer 1, and the buried layer 33 is a built-in Fabry Perot cavity with the passivating layer 12 being the top reflector and the buried layer 33 being the bottom reflector. In the rather usual case of coherent incident light, the cavity can be designed to maximize the light absorption within the active layer (i.e., the detector may be made resonant at that wavelength) at the expense of the intensity of the reflected and transmitted light. This, in turn, means enhanced internal quantum efficiency (i.e., the MSM quantum efficiency corrected for the finger shadowing factor) and reduced reflectance.

Figure 23:
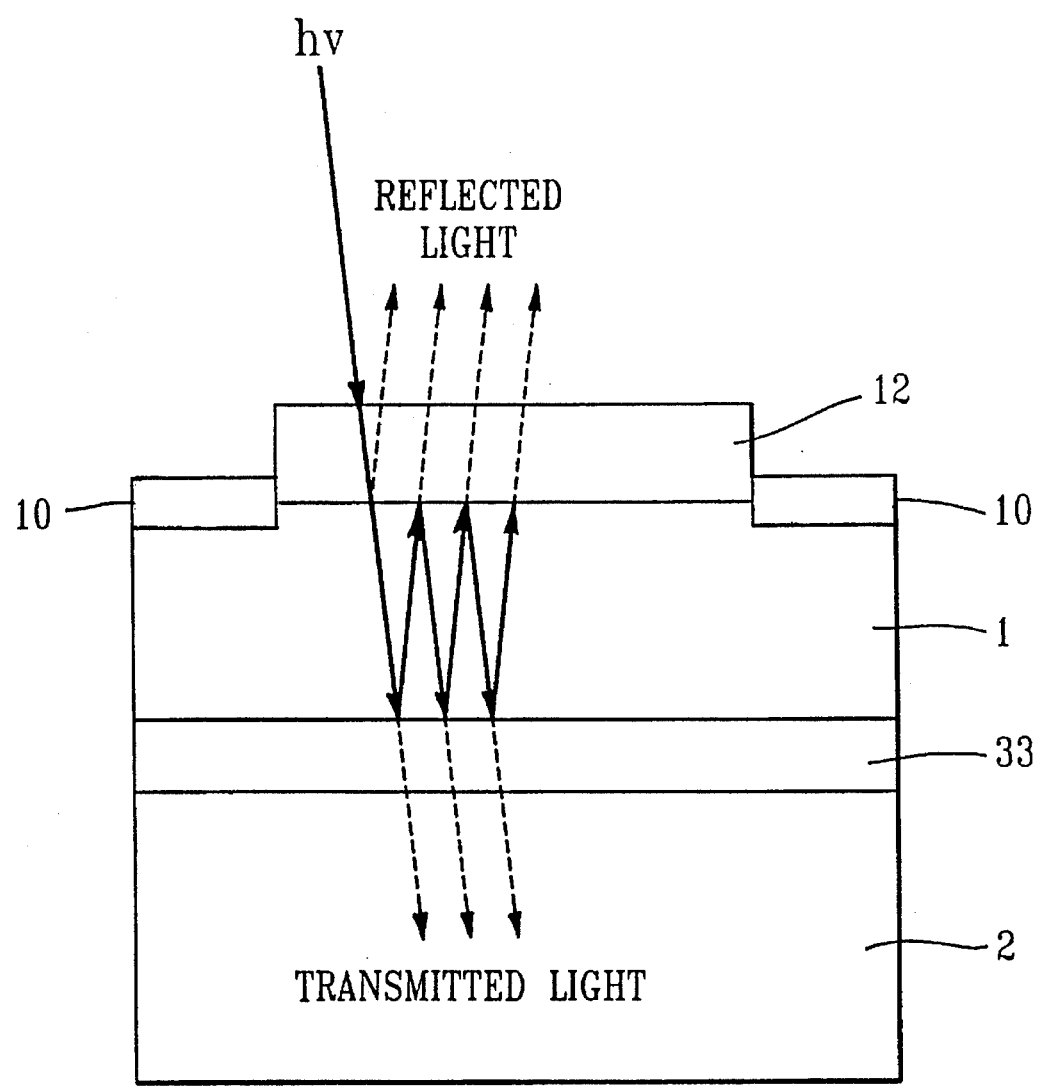
FIG. 23 is a schematic view in section of a portion of an MSM photodetector such as shown in FIG. 2 including a reflective barrier layer beneath the photoactive region of the type shown in FIG. 22, and illustrating the action of the resonant cavity on the incident light.

The principle of the "resonant detector" is illustrated in FIG. 23. At the resonant wavelength, the incoming light undergoes multiple reflections between the top and the bottom mirrors. Each reflection from one of the cavity mirrors results in the generation of additional electron-hole pairs as the light traverses the photoactive layer, resulting in a more sensitive photodetector. Tunability is a remarkable feature of the resonant structure. The quantum efficiency can be maximized at any desired wavelength by simply adjusting the layer thicknesses.

Based on the resonant cavity concept, different resonant photodetectors may be made in accordance with the present invention, some examples of which are the following.

EXAMPLE A.

A basic structure (structure A) such as shown in FIG. 22, where the passivating layer 12 and the dielectric buried layer 33, acting respectively as top and bottom mirrors, consist in a single layer of silicon dioxide or silicon nitride, is contemplated. The internal QE of an MSM photodetector such as shown in FIG. 22 may be maximized at a given wavelength by having the optical thicknesses of the three layers fulfill the following conditions:

passivating layer 12: integer multiple of $\lambda/2$ silicon layer 1: integer multiple of $\lambda/2$ buried layer 33: odd integer multiple of $\lambda/4$ where $\lambda$ is the operating wavelength. Normal incidence of the light has been assumed. More accurate calculations show that there is no substantial QE degradation off normal provided that the incidence angle is kept within ±10 degrees from normal.

Figure 24:
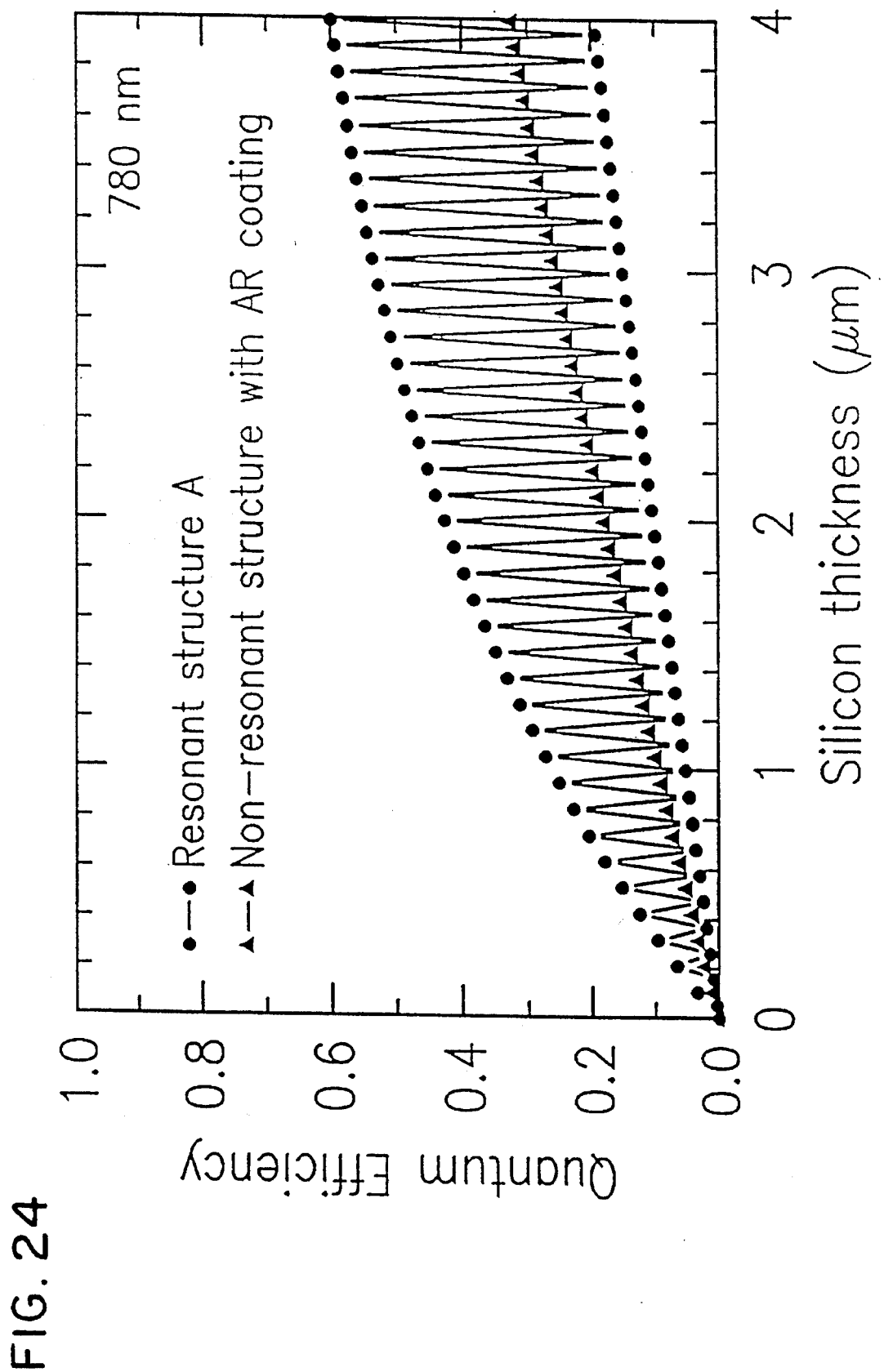
FIG. 24 illustrates the internal QE of an MSM photodetector such as shown in FIG. 22 versus silicon thickness at 780 nm, for optimal top (passivating) and buried silicon dioxide layer thicknesses, with the internal QE of a non-resonant MSM photodetector having a anti-reflecting passivating $SiO_2$ layer also shown for comparison.

FIG. 24 shows the internal QE of an MSM photodetector such as shown in FIG. 22 versus silicon thickness at a wavelength of 780 nm, for half-wave top (passivating) oxide and quarter-wave buried oxide layers (maxima and minima correspond to a silicon optical thickness of $\lambda/2$ and $\lambda/4$ respectively). The internal QE of a non-resonant MSM detector with a confined absorption region is also shown for comparison. The resonant structure exhibits an intrinsic QE that is strongly dependent on the active layer thickness. In the best case, the QE enhancement is greater than a factor of two, but in the worst case, the internal QE of the SOI layer drops below the QE of a non-resonant detector. The silicon incremental thickness required to switch from best-case to worst-case performance is about 500 Å. Thickness control of better than 1% is thus required for a typical total silicon thickness of 2 µm. The active layer thickness control can be somewhat relaxed by using the following combination of optical layer thicknesses:

passivating layer 12: odd integer multiple of $\lambda/4$ silicon layer 1: integer multiple of $\lambda/2$ buried layer 33: odd integer multiple of λ/4
where λ is the wavelength of the incident light.

Figure 25:
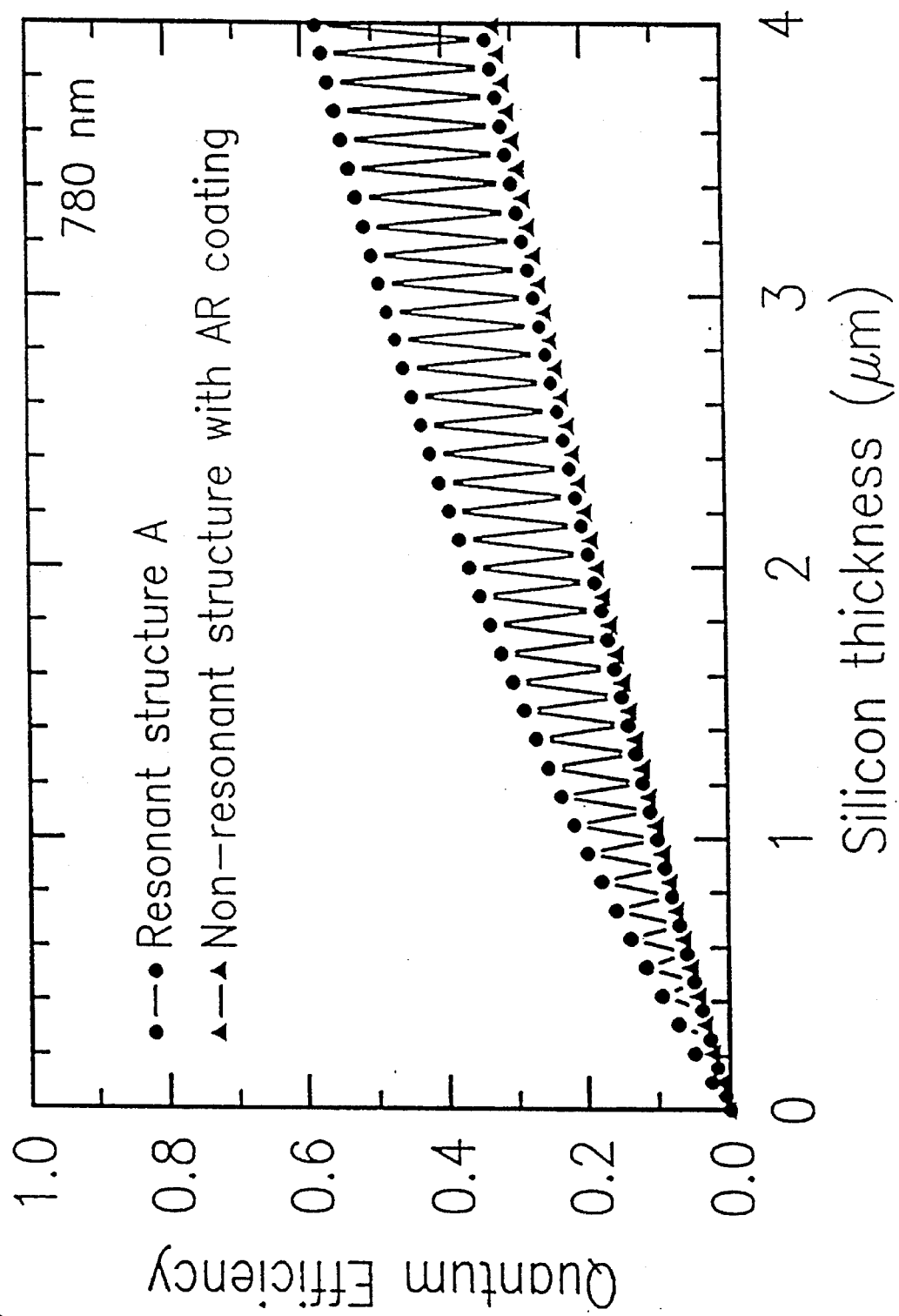
FIG. 25 is a showing as in FIG. 24, with the half-wave top $SiO_2$ layer replaced by a quarter-wave $SiO_2$ layer.
Figure 26:
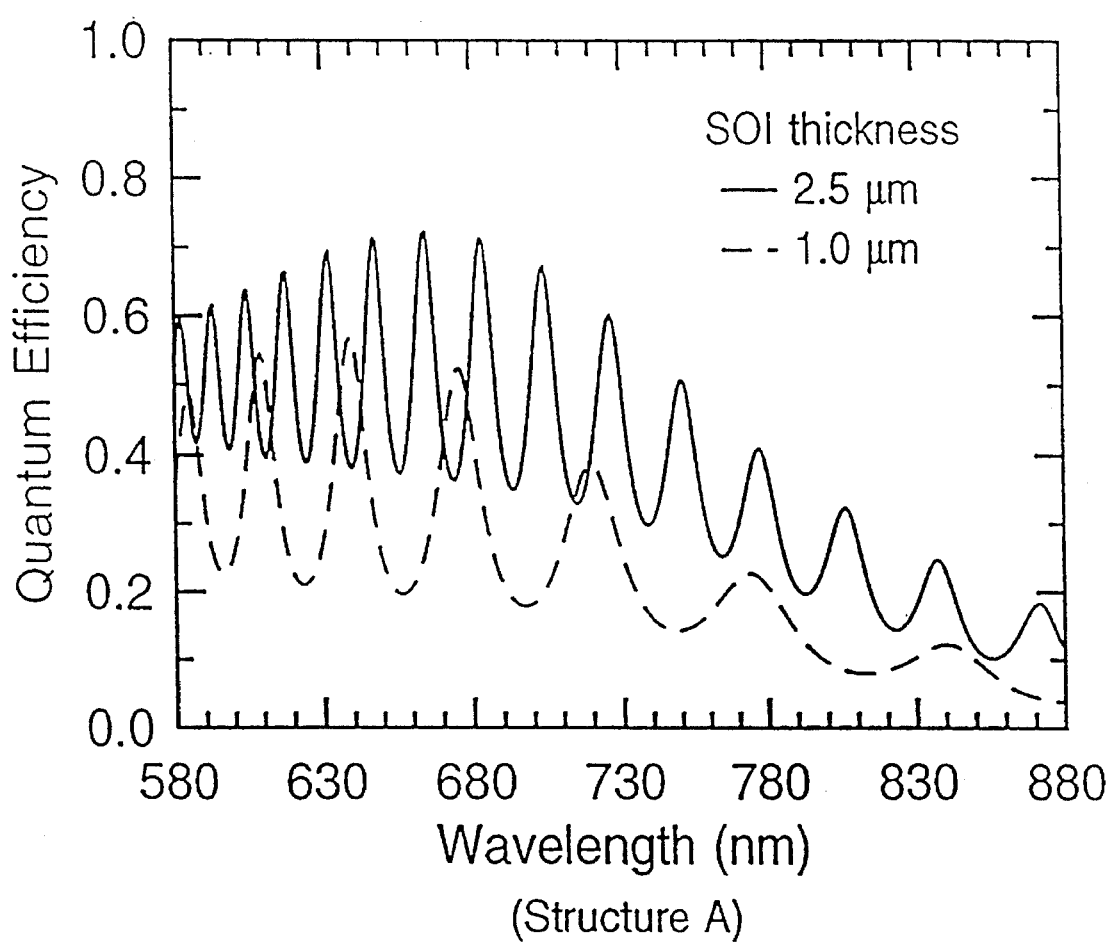
FIG. 26 illustrates the internal QE of an MSM photodetector such as shown in FIG. 22 as a function of wavelength for quarter-wave top and buried $SiO_2$ layers.

FIG. 25 shows the internal QE of an MSM photodetector such as shown in FIG. 22 as a function of the silicon thickness, for quarter-wave top and buried oxide layers. The best case QE is only slightly less than the optimal case shown in FIG. 24. However, the worst-case QE is never less than the bulk silicon case, thus avoiding excessive performance worsening in case of uncontrolled silicon thickness. The intrinsic QE as a function of wavelength for quarter-wave passivation oxide is shown in FIG. 26. Even though the detector has been optimized for a 780 nm operation wavelength, multiple absorption peaks occur in the visible region and a single absorption peak occurs at ≈840 nm.

EXAMPLE B.

Figure 27:
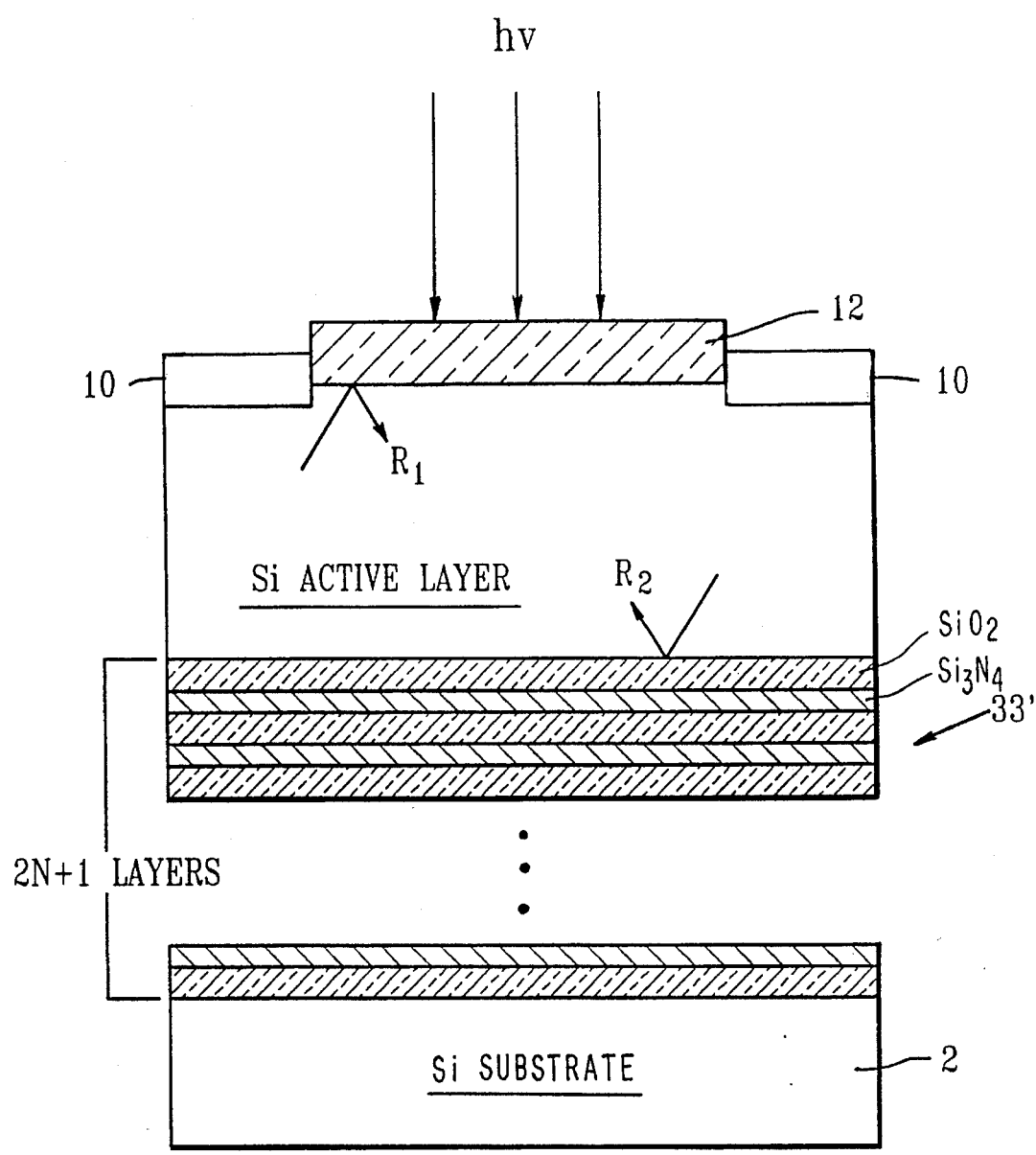
FIG. 27 is a schematic view in section of an MSM photodetector such as shown in FIG. 2 including a multilayer dielectric mirror beneath the photoactive region of the type shown in FIG. 22.

Another structure (structure B) is contemplated wherein the internal QE of the MSM resonant detector is enhanced by increasing the reflectivity of the buried reflector. This can be done by replacing the buried dielectric layer 33 with a stack of alternate layers of $SiO_2$ and $Si_3N_4$. A schematic cross section of such an MSM resonant photodetector with a buried mirror 33' is shown in FIG. 27. It is known that a high reflectance can be obtained from a stack of quarter-wave dielectric layers of alternate high and low refractive index. $SiO_2$ and $Si_3N_4$ are chosen for such layers because: i) they are widely used in VLSI technology; and ii) very efficient dielectric mirrors can be fabricated even with a limited number of layers, because of the relatively high refractive index ratio as explained below. The maximum reflectance is achieved with an odd number of layers and the low-index layers outermost. The optical admittance, Y, of this quarter-wave mirror, for normal incidence, is:

$$Y = (n_L/n_H)^{2p} n_L^2 / n_{sub}$$

where $n_H$ and $n_L$ are the high ($Si_3N_4$) and low (($SiO_2$) refractive indexes respectively, $n_{sub}$ is the substrate refractive index and (2p+1) the number of layers in the stack. The mirror reflectance $R_2$ is given by:

$$R_2 = |(n_{Si} - Y)/(n_{Si} + Y)|^2$$

The greater the number of layers the greater the reflectance. The thicknesses of the layers constituting the reflector are chosen such that they are equal to one-quarter of the design wavelength. For a design wavelength of 780 nm, possible thicknesses are 950 and 1340 Å for $Si_3N_4$ and $SiO_2$, respectively.

Figure 28:
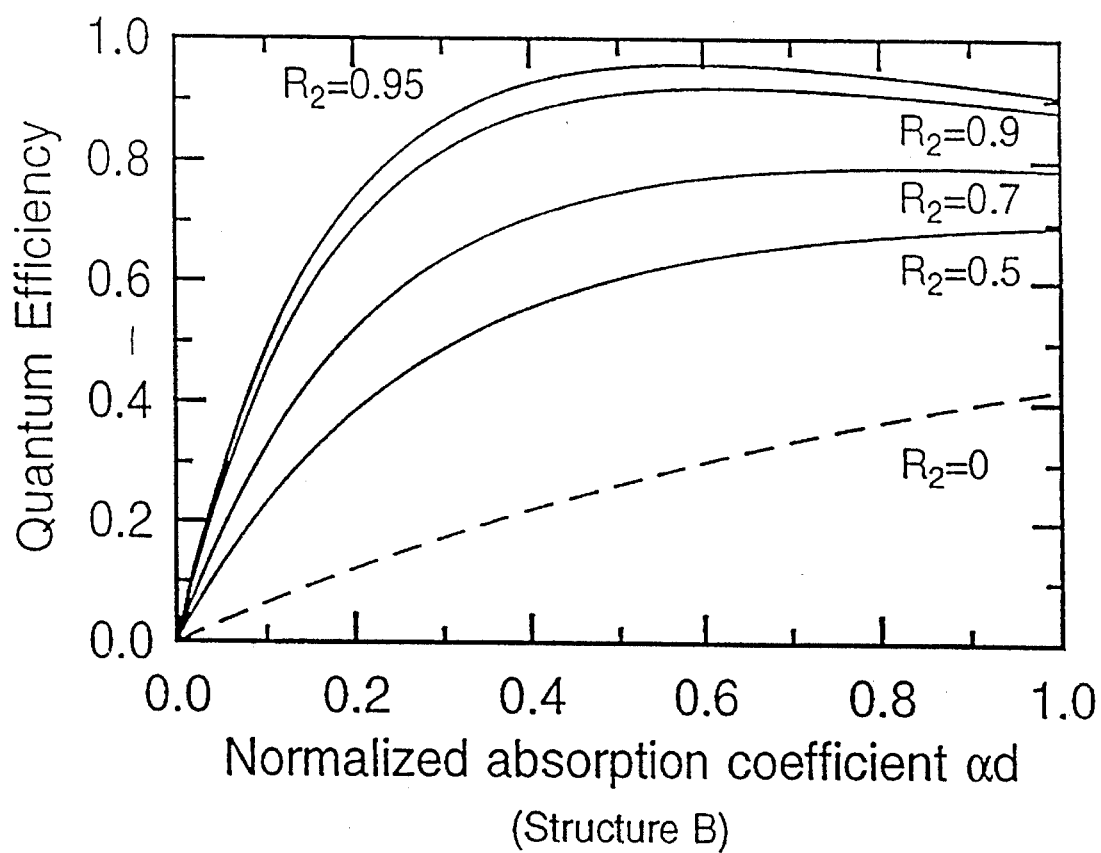
FIG. 28 shows the calculated internal QE of an MSM photodetector, such as shown in FIG. 27, at the resonant wavelength as a function of $\alpha d$ for different values of the buried mirror reflectance $R_2$, with a half-wave passivating $SiO_2$ layer ($R_1 \approx 0.33$) being considered and the internal QE of a non-resonant photodetector ($R_2=0$) represented by a dashed line.

The maximum QE for an MSM photodetector having the structure of this Example B is obtained at the resonant wavelength, i.e., when the optical thickness of the active layer is an integer multiple of λ/2. In order to present the simulated results in a concise format, the αd parameter (known in the literature as 'normalized absorption coefficient') is introduced, where α is the Si absorption coefficient and d is the Si thickness. FIG. 28 shows the calculated QE at the resonant wavelength as a function of αd for different values of the buried mirror reflectance $R_2$. A half-wave passivation oxide ($R_1 \approx 0.33$) is considered. The QE of a non-resonant photodetector ($R_2 = 0$) is represented by a dashed line.

EXAMPLE C.

Figure 29:
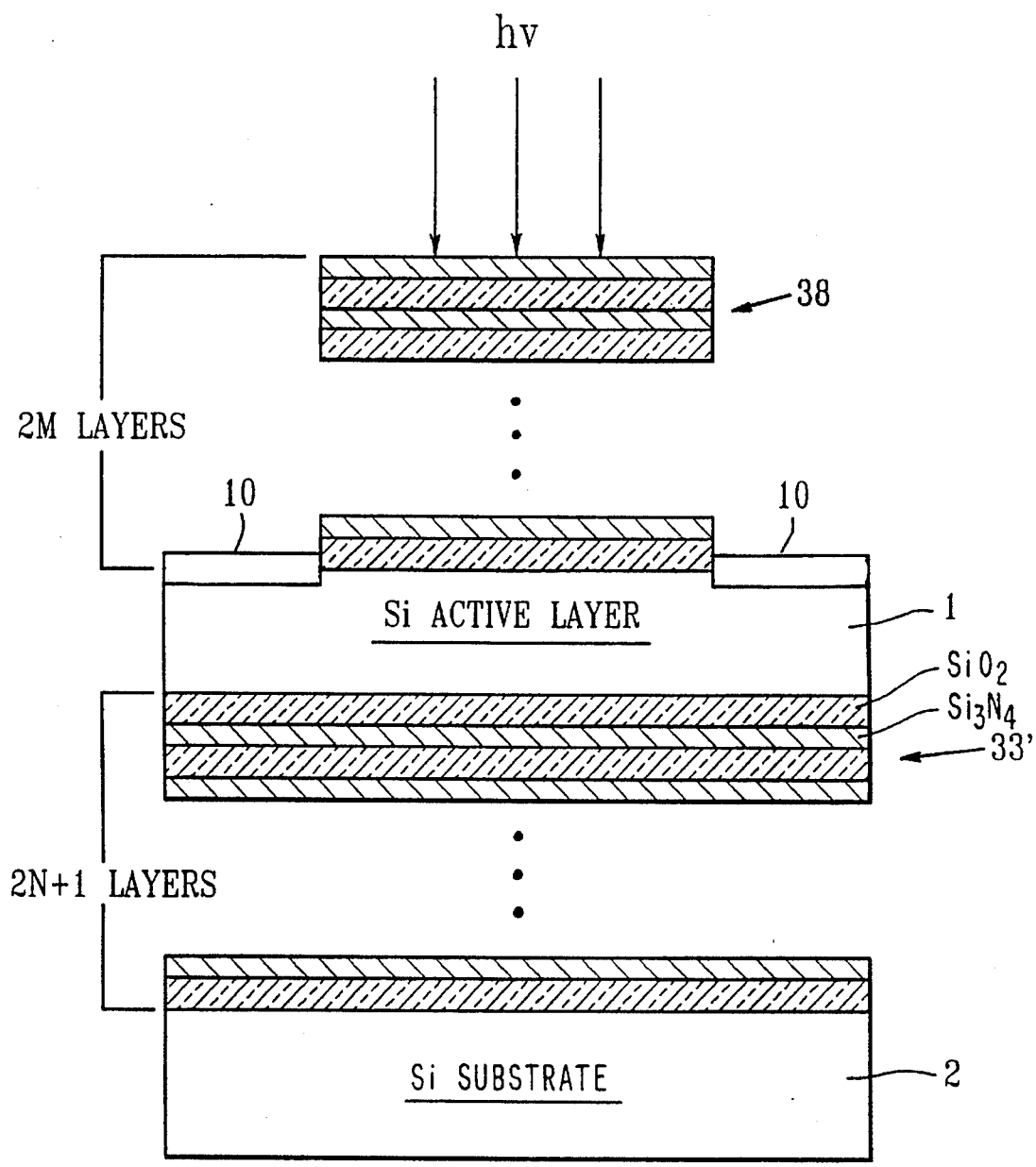
FIG. 29 is a schematic view in section of an MSM photodetector such as shown in FIG. 2 including a multilayer dielectric mirror beneath the photoactive region and a multilayer dielectric mirror replacing the passivating layer.

A further structure (structure C) is contemplated wherein the internal QE of the MSM resonant detector is further improved by replacing the passivating layer 12 with a dielectric mirror 38, i.e., an additional reflector structure is grown above the active device (FIG. 29). The maximum reflectance is achieved with an even number of $Si_3N_4$-$SiO_2$ pairs, with the first layer (next to the active layer) being $SiO_2$. The optical admittance, Y, of the top mirror, for normal incidence, is given by $$Y = (n_L/n_H)^{2p}$$

provided that the incident medium is air. In this case the number of layers in the stack is 2p.

The mirror reflectance $R_1$ can then be calculated as shown above for $R_2$.

Figure 30:
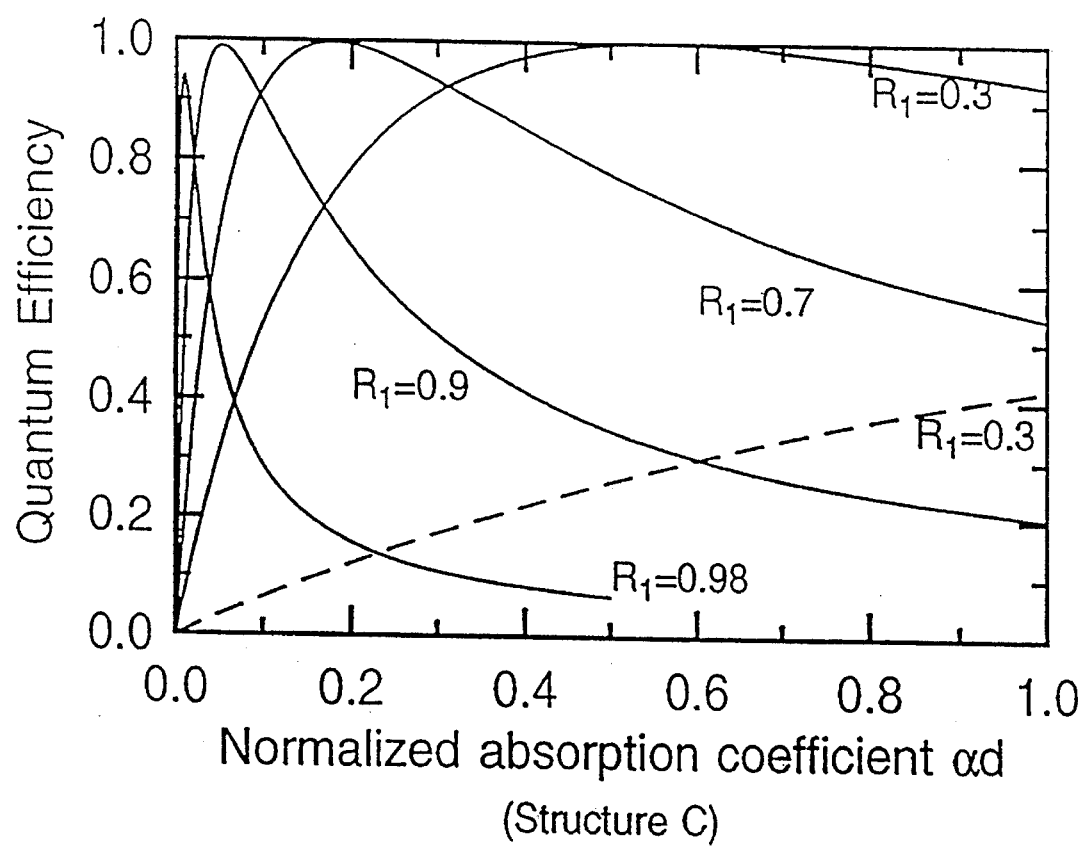
FIG. 30 shows the calculated internal QE of an MSM photodetector such as shown in FIG. 29 at the resonant wavelength as a function of αd for different values of the top mirror reflectance ($R_1$) and a fixed buried mirror reflectance $R_2 \approx 0.999$, with the internal QE for no buried mirror ($R_2=0$) also given by a dashed line.

FIG. 30 shows the internal QE of an MSM photodetector having the structure of this Example C at the resonant wavelength (i.e., Si thickness=integer multiple of λ/2) as a function of αd for different values of the top mirror reflectance ($R_1$) and a fixed buried mirror reflectance $R_2 \approx 0.999$. The QE for no buried mirror ($R_2 = 0$) is also given by a dashed line. It should be noted that very thin (<0.5 μm) and efficient (QE>0.9) photodetectors can be obtained provided that the top mirror reflectance is greater than 0.9. The quantum efficiency at a certain αd is maximized when $$R_1 = R_2 \exp(-\alpha d)$$

as shown in:

K. KISHINO, S. UNLU, J. I. CHYI, J. REED, L. ARSENAULT, AND H. MORKOC, "Resonant Cavity-Enhanced (RCE) Photodetectors," IEEE J. Quantum Electron., vol. 27, no. 8, pp. 2025–2034, 1991.

Figure 31:
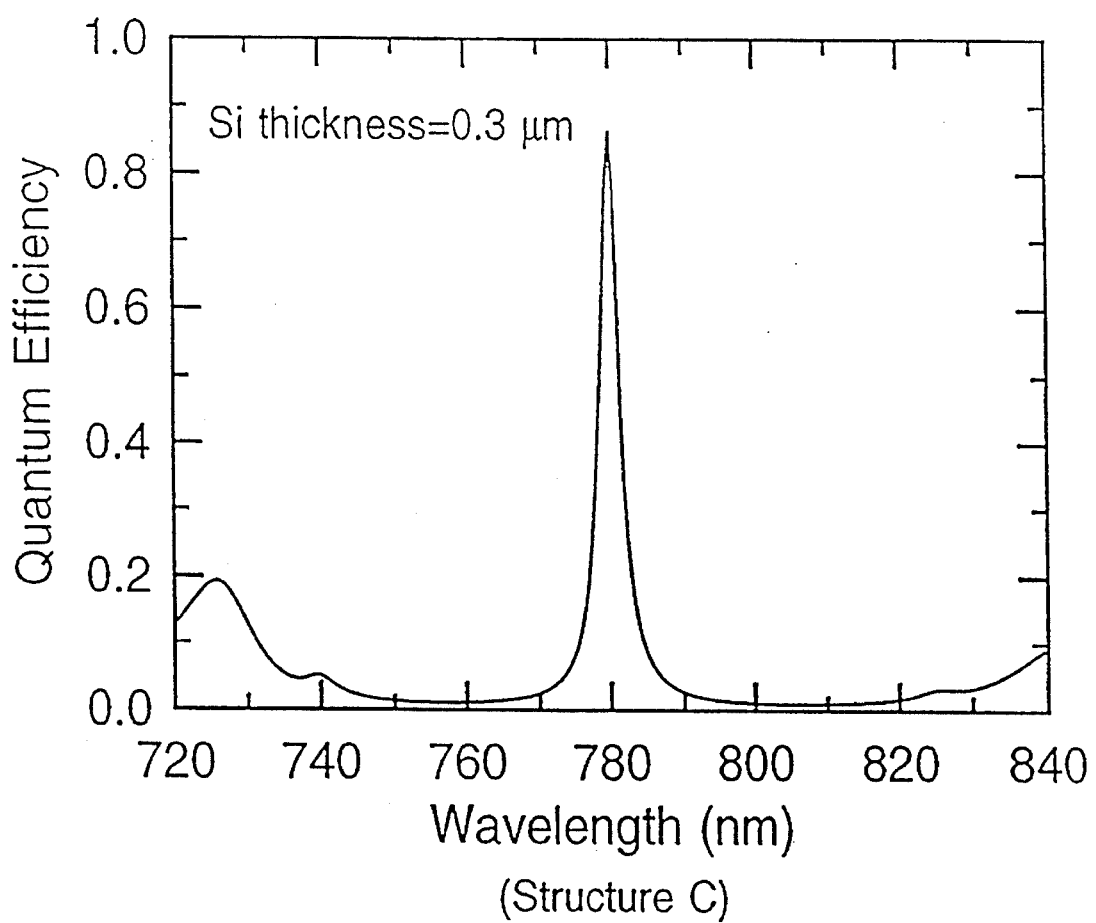
FIG. 31 shows the calculated internal QE of an MSM photodetector such as shown in FIG. 29 with $R_1=0.93$, $R_2=0.99$ and silicon thickness=0.3 μm as a function of wavelength.

Another effect related to the increased mirror reflectances is an increased wavelength selectivity, i.e., the "finesse" of the Fabry-Perot filter is increased. This is shown in FIG. 31, where the QE of the structure C with $R_1 = 0.93$, $R_2 = 0.99$ and Si thickness=0.3 μm is plotted as a function of wavelength. Because of the sharper resonance, the tuning of the photodetector requires a very careful control of the layer thicknesses, that of the active layer 1 being the most critical.

EXAMPLE D.

Figure 32:
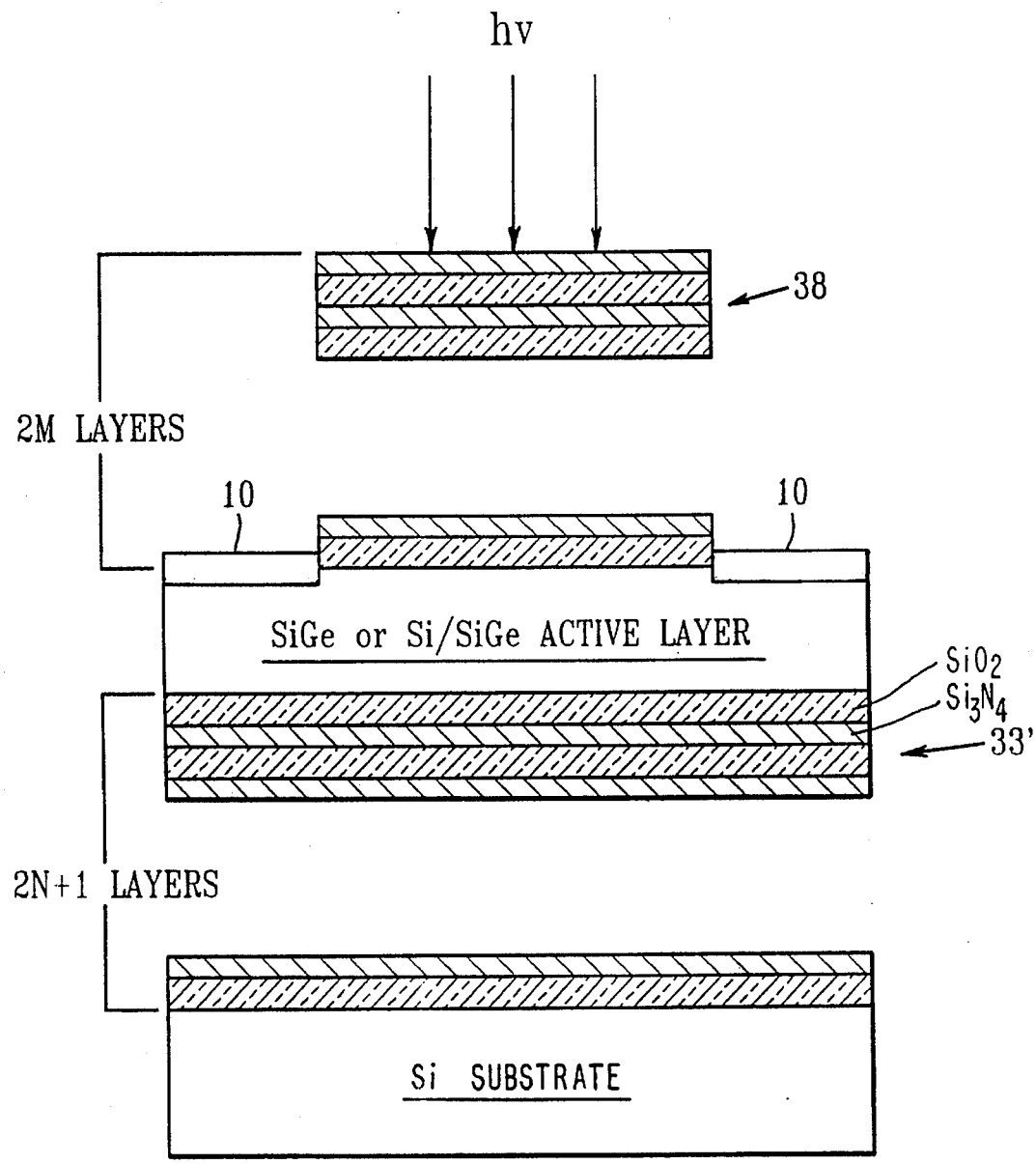
FIG. 32 is a schematic view in section of an MSM photodetector such as shown in FIG. 29, in which the silicon photoactive layer has been replaced by a layer of Si-Ge alloy.
Figure 33:
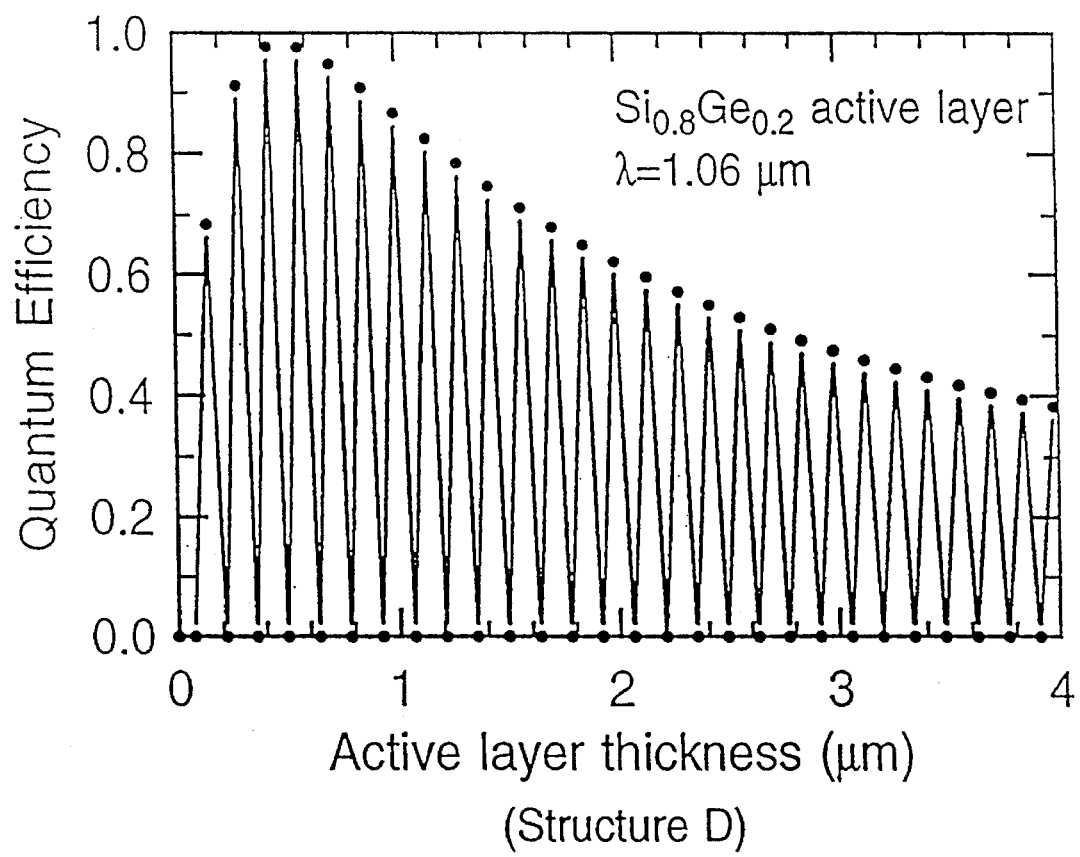
FIG. 33 shows the calculated internal QE of an MSM photodetector such as shown in FIG. 31 with a $Si_{0.8}Ge_{0.2}$ active layer, as a function of the active layer thickness, at λ=1.06 μm, and considering a 13 layer $Si_3N_4$-$SiO_2$ buried mirror and a 8 layer top mirror with a substrate of bulk Si.

A further improvement can be obtained by replacing the silicon active layer 1 with a SiGe alloy or a strained Si/SiGe superlattice, or a combination of the two. This device modification would be very effective at longer wavelengths (>1 μm), where the Si absorption coefficient is too low to get an efficient photodetector. A schematic cross section of this modified structure (structure D) is shown in FIG. 32. A Si or SiGe substrate can be used. As an example, FIG. 33 shows the QE of an MSM photodetector having the structure D with a $Si_{0.8}Ge_{0.2}$ active layer, as a function of the active layer thickness, at 1.06 μm wavelength. A 13 layer $Si_3N_4$-$SiO_2$ buried mirror and an 8 layer top mirror were considered along with a substrate of bulk Si.

EXAMPLE E.

Figure 34:
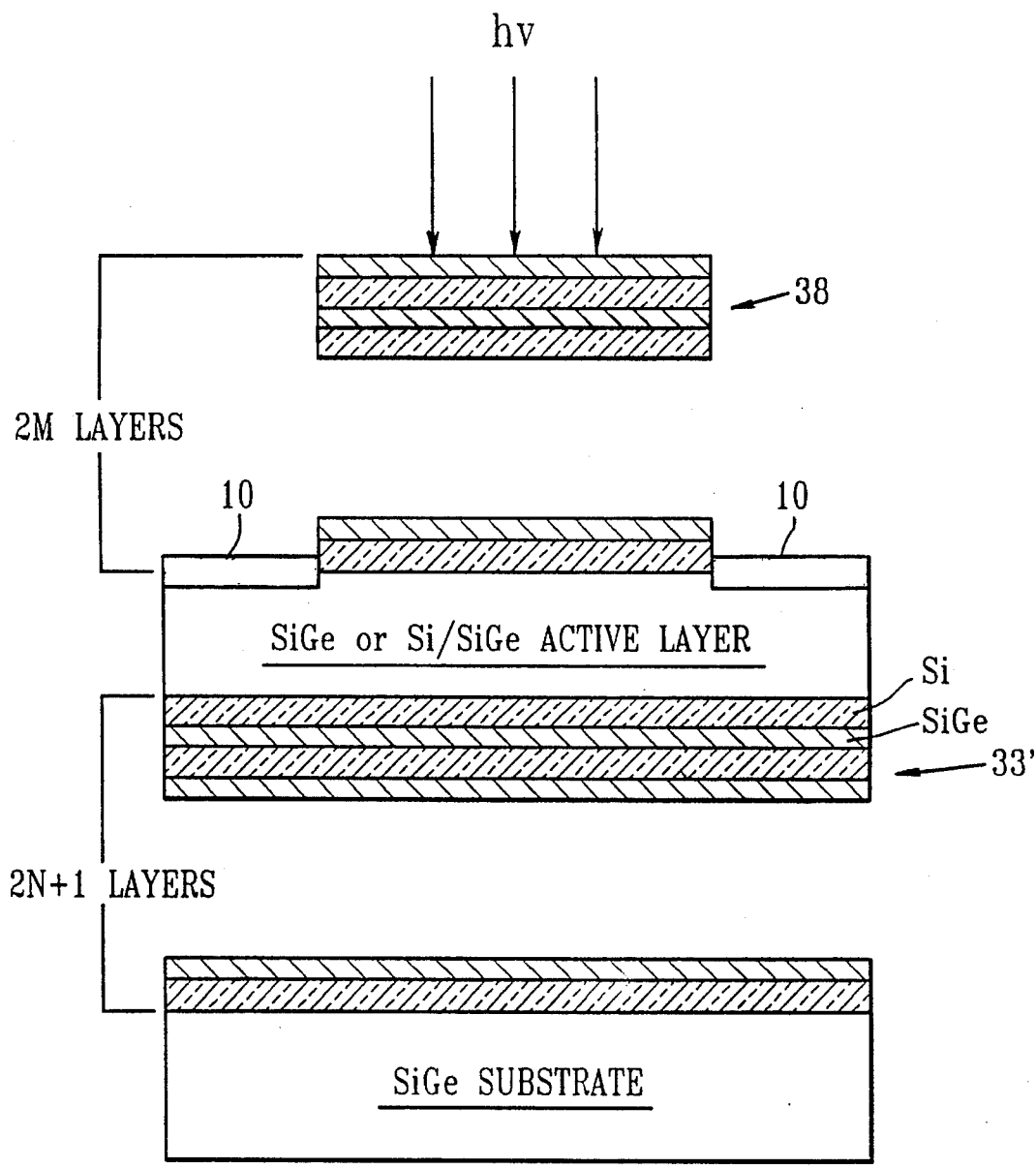
FIG. 34 is a schematic view in section of an MSM photodetector such as shown in FIG. 32, in which the dielectric multilayer mirrors have been replaced with semiconductor mirrors in the form of multiple layers of silicon and Si-Ge alloy.

Another long-wavelength (1.3 μm) silicon-based resonant photodetector may be implemented wherein the mirrors 33 and 34 are built by growing alternate Si and SiGe. This structure (structure E) would allow a simpler fabrication procedure based on Si and SiGe epitaxy. A schematic cross section of this structure E is shown in FIG. 34. Because the Si/SiGe mirrors must not absorb at the operating wavelength, a Si-rich $Si/Si_{1-x}Ge_x$ multilayer (e.g., x=0.2) would be used for the mirrors' fabrication. On the other hand, a highly absorptive Ge-rich (e.g, x=0.8) $Si_{1-x}Ge_x$ alloy or $Si/Si_{1-x}Ge_x$ superlattice must be utilized for the fabrication of the active layer. While it offers some advantageous utility, it should be appreciated that an embodiment such as structure E may pose certain problems:

1. The minimum thickness of the SiGe layers constituting the mirrors is about 900 Å. This value is well above the critical thickness at which the strain due to lattice mismatch between Si and SiGe is relaxed by introduction of misfit dislocation.

2. It is well known that strain increases the absorption coefficient of Si and SiGe. This may cause excessive light absorption in the mirrors, that results in a low mirror reflectance.

3. The refractive index ratio of Si and $Si_{0.8}Ge_{0.2}$ at 1.3 μm is too low to obtain an efficient quarter-wave mirror, unless a large number of layers is employed. For example, 40 pairs of $Si-Si_{0.2}Ge_{0.2}$ are needed to get a bottom mirror reflectance of 0.99.

All the aforementioned resonant structures may be fabricated on silicon-in-insulator (SOI) substrates which are well-known in silicon IC technology. The SOI layer may be made by the SIMOX (Separation by IMplantation of OXygen) process or by the ELO (Extended Lateral Overgrowth) process. SOI substrates consist of a thin layer of single crystal silicon separated from the silicon substrate by a thin oxide layer or similar insulating material, such as silicon nitride or silicon oxynitride. The surface layer is the photoactive layer and is electrically isolated from the substrate. The performance of a photodetector in an SOI substrate will be much faster than a similar device built in a conventional silicon substrate. SOI technology is a broad field of research and many different processes have been described in the literature to build SOI substrates. Many examples of these fabrication methods are discussed in papers presented at the 4th International Symposium on Silicon-On-Insulator Technology and Devices, and published by the Electrochemical Society Extended Abstracts, vol. 90-1, Spring Meeting 1990, Montreal, Canada. These methods include, the above-noted SIMOX and ELO processes, as well as the ZMR, i.e., Zone Melt Recrystallization, DWB, i.e., Direct Wafer Bonding, and BESOI, i.e., Bond and Etchback Silicon On Insulator processes.

A technique for wafer bonding is mandatory when a buried dielectric mirror structure is considered. In this case, the multilayer mirror should be fabricated by chemically vapor depositing alternate layers of $Si_3N_4$ and $SiO_2$ on a Si or SiGe substrate. A separate Si or SiGe wafer will then be bonded on the top of the mirror and thinned down to the desired thickness. Care should be taken in order that the total thickness of the last $SiO_2$ mirror layer be an odd integer multiple of λ/4.

The key problem related to the implementation of the SOI-MSM resonant detectors is the strict thickness control required for the buried oxide layer, the SOI layer and the top (passivating) oxide layer. As shown in FIG. 24, the detector QE is strongly dependent on these thicknesses. While it is relatively easy to control the thickness of the thermally grown or CVD $SiO_2$ and $Si_3N_4$ layers within 100 Å, current technology does not allow such a strict control on the SOI film thickness. However, strict thickness control can be avoided, provided that an accurate SOI thickness measurement is taken prior to the passivating film deposition being performed. In this regard, the thickness of the SOI film can be thinned down to the optimal value by wet etching or by growing a suitable amount of thermal silicon dioxide. The latter measure relies on the fact that when a silicon dioxide film of thickness, 'd', is formed, a layer of silicon of thickness, '0.45 d', is consumed, thus allowing an accurate SOI thickness control.

Additionally, in VLSI applications the device may be isolated electrically by standard VLSI isolation techniques such as LOCOS, deep and shallow trench isolation, and mesa isolation. Light impingement on the device may be controlled or restricted by means of patterned metal film apertures that are integrated into the device, and the device may be provided with a guard ring structure which surrounds each electrode to reduce the dark current.

In summary, it will be seen that improved MSM and LPIN photodetectors and a method for fabricating them have been disclosed. These photodetectors are suitable for extensive use in short wavelength applications, such as for optical interconnects, and wide use by chip and computer manufacturers as they are easily integrable with Si VLSI technology.

What is claimed is:

1. A metal-semiconductor photodetector comprising:

a substrate having a semiconducting surface layer comprising silicon;

a set of electrodes on said surface layer comprising a plurality of interdigitated members, said members having a lower surface facing and forming a first interface with said semiconducting surface layer and having side surfaces facing but being spaced from each other, said members comprising a material having a moderate to high electron and hole barrier height to silicon; and a passivating layer disposed on said surface layer between said interdigitated members through which light may pass into said semiconducting surface layer, said passivating layer having a lower surface forming a second interface with said semiconducting surface layer, said second interface being disposed not higher than said first interface and said passivating layer being sufficiently thick that said side surfaces of said interdigitated members interface substantially completely with and are mutually separated by said passivating layer, said passivating layer thereby substantially completely surrounding said interdigitated members at said side surfaces thereof to reduce peripheral fringing electric fields between said interdigitated members when a voltage difference is applied across adjacent interdigitated members.

2. A photodetector as in claim 1 wherein said interdigitated members are of a material selected from a group consisting of PtSi, $TiSi_2$, $WSi_2$, $PdSi_2$, W, Ti, Pt, Pd, Hf, ITO, and combinations thereof.

3. A photodetector as in claim 1 wherein said passivating layer is of a material selected from the group consisting of $SiO_2$, $Si_3N_4$, silicon oxynitride, and combinations thereof.

4. A photodetector as in claim 3 wherein said passivating layer is transparent and the thickness of the transparent passivating layer is such as to act as an antireflective film at the desired wavelength of operation of the photodetector.

5. A photodetector as in claim 1 wherein said semiconducting surface layer further comprises germanium.

6. A photodetector as in claim 5 wherein said semiconducting surface layer of silicon and germanium is overcoated with a thin layer of single crystal silicon.

7. A photodetector as in claim 1 wherein said plurality of interdigitated members are formed in two electrically separate sets of electrodes and further comprising separate contact means respectively connected to each of said electrode sets for applying a voltage between said electrodes, and a barrier layer disposed at a predetermined distance below said second interface for limiting collection of light generated carriers by said electrodes to carriers generated in said semiconducting surface layer between said barrier layer and said electrodes.

8. A photodetector as in claim 7 wherein said barrier layer comprises a layer of transparent and insulating material, which is also non-reflecting.

9. A photodetector as in claim 7 wherein said barrier layer comprises a layer of optically absorbing material.

10. A photodetector as in claim 7 wherein said barrier layer comprises a layer of optically reflecting material forming a resonant structure.

11. A photodetector as in claim 10 optimized for operation at a given wavelength $\lambda$ by having the optical thicknesses of said semiconducting layer, said passivating layer and said barrier layer fullfill the following conditions:

passivating layer: integer multiple of $\lambda/2$;

semiconducting layer: integer multiple of $\lambda/2$;

blocking layer: odd integer multiple of $\lambda/4$.

12. A photodetector as in claim 11 wherein the optical thickness of the passivating layer is an odd integer multiple of the operating wavelength.

13. A photodetector as in claim 7 wherein said barrier layer comprises a multilayer dielectric mirror.

14. A photodetector as in claim 13 further comprising a multilayer dielectric mirror disposed on said semiconducting surface layer between said interdigitated members.

15. A photodetector as in claim 7 wherein said barrier layer comprises a multilayer semiconductor mirror made of alternate Si and SiGe layers, and further comprising a multilayer semiconductor mirror disposed on said semiconducting surface layer between said interdigitated members.

16. A photodetector as in claim 1 wherein said substrate comprises a silicon-on-insulator (SOI) substrate.

\* \* \* \* \*